(12) United States Patent
Hamaguchi et al.

(10) Patent No.: US 9,593,695 B2
(45) Date of Patent: Mar. 14, 2017

(54) FAN DEVICE ATTACHMENT STRUCTURE

(75) Inventors: Takashi Hamaguchi, Tokyo (JP); Michihito Watarai, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 589 days.

(21) Appl. No.: 14/126,032

(22) PCT Filed: Jun. 16, 2011

(86) PCT No.: PCT/JP2011/003454
§ 371 (c)(1),
(2), (4) Date: Apr. 14, 2014

(87) PCT Pub. No.: WO2012/172614
PCT Pub. Date: Dec. 20, 2012

(65) Prior Publication Data
US 2014/0234100 A1 Aug. 21, 2014

(51) Int. Cl.
F04D 29/66 (2006.01)
F04D 25/06 (2006.01)
(Continued)

(52) U.S. Cl.
CPC ....... F04D 29/661 (2013.01); F04D 25/0613 (2013.01); F04D 29/601 (2013.01);
(Continued)

(58) Field of Classification Search
CPC .... F04D 29/661; F04D 29/668; F04D 29/646; F04D 29/601; F04D 25/0613; H05K 7/20727; F16F 15/073
(Continued)

(56) References Cited

U.S. PATENT DOCUMENTS 5,969,941 A 10/1999 Cho
7,379,300 B1 5/2008 Chen
(Continued)

FOREIGN PATENT DOCUMENTS

JP 1-159565 U 11/1989
JP 05-084195 A 4/1993
(Continued)

OTHER PUBLICATIONS

Japanese Office Action received in corresponding Japanese Application No. 2013-520327 dated Feb. 3, 2015.
(Continued)

*Primary Examiner* — Hoang Nguyen
(74) *Attorney, Agent, or Firm* — Mattingly & Malur, PC

(57) ABSTRACT

A fan device mounting structure is provided, which is capable of sufficiently suppressing transmission of vibrations in X, Y, and Z directions generated from a fan device, that is, all translational-direction vibrations and all axial-rotation-direction vibrations, to a chassis in which the fan device is mounted. The fan device mounting structure includes: a fan device 1; a chassis 4 in which the fan device 1 is mounted; and at least a pair of flat springs 2, each of which has its one end attached to the fan device 1 and extending outwards from the fan device 1 and bending and has the other end attached to outside a fan device located area, wherein both opposite faces of the fan device 1 facing each other are supported by the respective flat springs 2 and attached to the chassis 4 at positions separate from each other.

15 Claims, 23 Drawing Sheets

(51) Int. Cl.
*F04D 29/60* (2006.01)
*H05K 7/20* (2006.01)
*F04D 29/64* (2006.01)
*F16F 15/073* (2006.01)

(52) U.S. Cl.
CPC ......... *F04D 29/646* (2013.01); *F04D 29/668* (2013.01); *H05K 7/20727* (2013.01); *F16F 15/073* (2013.01)

(58) Field of Classification Search
USPC ............. 415/213.1; 361/678, 690, 694, 495; 454/184
See application file for complete search history.

(56) References Cited

U.S. PATENT DOCUMENTS

| 2002/0060900 | A1  | 5/2002  | Qiu |
|---|---|---|---|
| 2004/0162018 | A1* | 8/2004  | Lee ................... H05K 7/20172 454/184 |
| 2006/0169437 | A1  | 8/2006  | Yano et al. |
| 2006/0227514 | A1* | 10/2006 | Kang ................... H04N 5/7458 361/719 |
| 2008/0025848 | A1  | 1/2008  | Wu et al. |
| 2008/0045133 | A1* | 2/2008  | Pfannenberg .......... B01D 46/10 454/184 |
| 2010/0124019 | A1  | 5/2010  | Meguro et al. |
| 2013/0130608 | A1* | 5/2013  | Hartmann ............. F04D 29/545 454/184 |

FOREIGN PATENT DOCUMENTS

| JP | 07-263877 A   | 10/1995 |
|---|---|---|
| JP | 10-240385 A   | 9/1998  |
| JP | 2001-313483 A | 11/2001 |
| JP | 2002-340090 A | 11/2002 |
| JP | 2006-216678 A | 8/2006  |
| JP | 2008-31980 A  | 2/2008  |
| JP | 2008-130766 A | 6/2008  |
| JP | 2010-043575 A | 2/2010  |
| JP | 2010-121540 A | 6/2010  |

OTHER PUBLICATIONS

Japanese Office Action received in Japanese Application No. 2013-520327 dated Jul. 1, 2014.

* cited by examiner

FIG.3
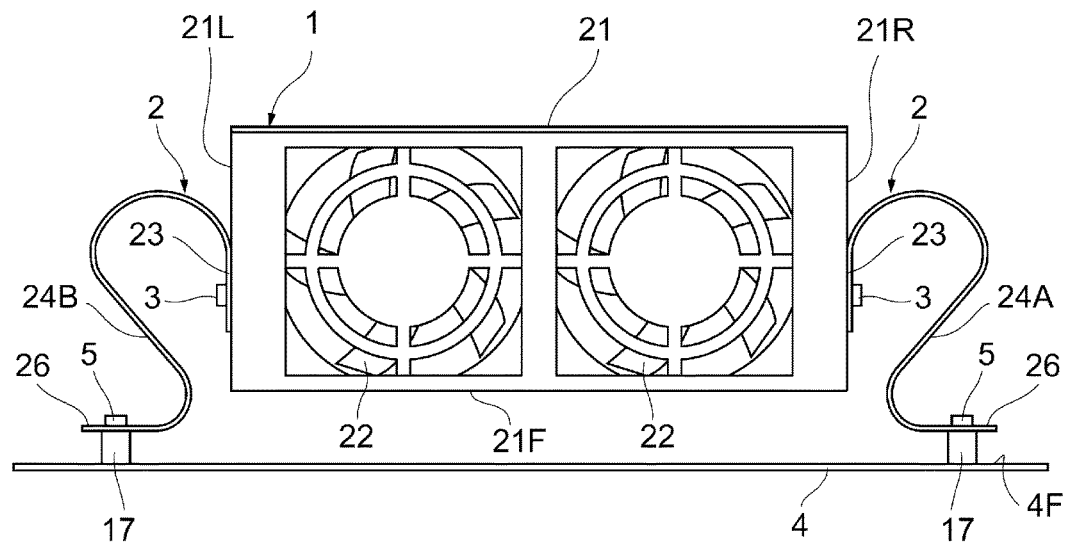
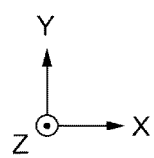

FIG.23
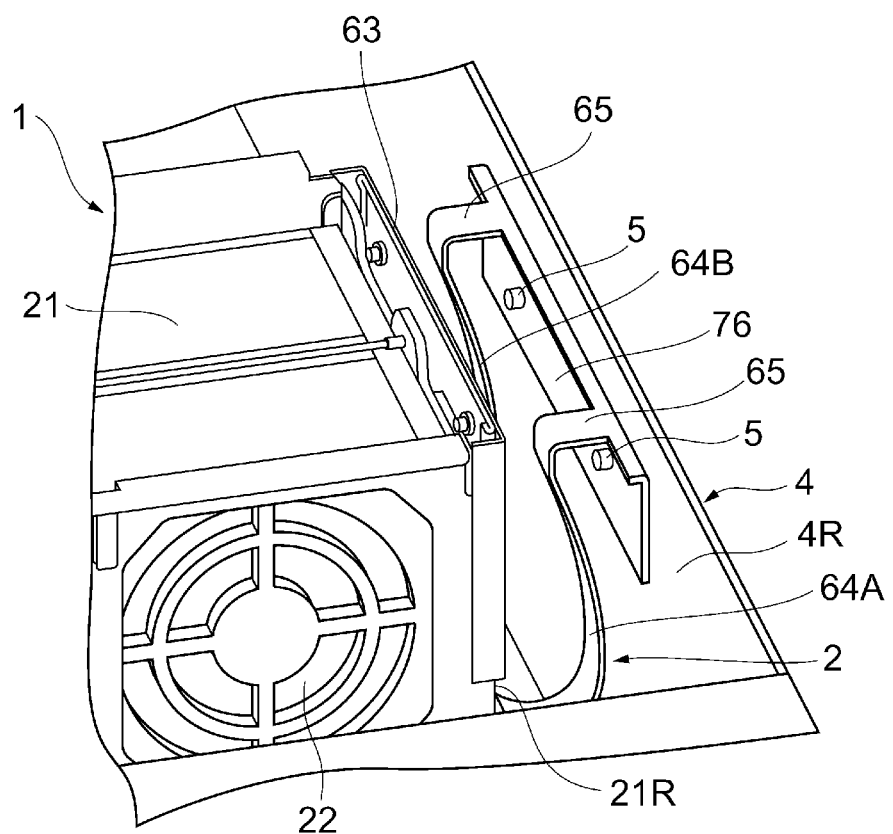
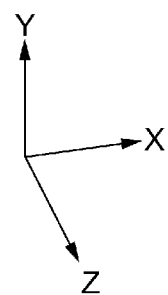

FAN DEVICE ATTACHMENT STRUCTURE

TECHNICAL FIELD

The present invention relates to a fan device attachment structure.

BACKGROUND ART

Conventionally, a fan device placed inside various equipment has, for example, its outside surface contact an inside surface of a chassis for the equipment via an elastic material such as rubber or resin, thereby allowing the elastic material to absorb vibrations generated from the fan device and preventing transmission of the vibrations to the chassis for the equipment (for example, see Patent Literature 1 and 2).

Moreover, an electronic component support for connecting a first electronic component mounted on a printed circuit board and a second electronic component which is mounted on the printed circuit board and easily vibrates in a direction generally perpendicular to an easily vibratable direction of the first electronic component is introduced. This electronic component support includes a plurality of component fixing parts and which elastically hold each of the first electronic component and the second electronic component between them, and a connector for coupling the component fixing parts so that their positions can be changed; the electronic component support can be attached to the first electronic component and the second electronic component by a simple manual action; and it is intended to prevent vibrations of the electronic components to the printed circuit board (see, for example, Patent Literature 3).

CITATION LIST

Patent Literature

[Patent Literature 1]
[Patent Literature 1] Japanese Patent Application Laid-Open (Kokai) Publication No. 2001-313483
[Patent Literature 2] Japanese Patent Application Laid-Open (Kokai) Publication No. 2010-121540
[Patent Literature 3] Japanese Patent Application Laid-Open (Kokai) Publication No. 07-263877

SUMMARY OF INVENTION

Problems to be Solved by the Invention

However, a vibration suppressing effect of a fan device mounting structure which suppresses vibrations generated from the fan device by placing the fan device mounting structure in the chassis via the elastic material such as rubber or resin is not sufficient. For example, when the fan device is mounted in information equipment or the like, there is fear that performance degradation or hardware failure of hard disk drives of the information equipment may be caused.

Furthermore, the electronic component support described in Patent Literature 3 suppresses vibrations of the electronic components by coupling the electronic components, which are mounted on the printed circuit board, to each other; however, the vibration suppressing effect would not be sufficient unless easily vibratable directions of the coupled electronic components are generally perpendicular to each other. Also, no particular means is contrived to suppress the vibrations of the electronic components, which vibrate themselves, by securely attaching the electronic components, which vibrate themselves, like the fan device to a chassis in which the electronic components are placed.

The present invention was devised in light of the above-described circumstances and it is an object of the invention to provide a fan device mounting structure capable of sufficiently suppressing transmission of vibrations in X, Y, and Z directions generated from a fan device, that is, all translational-direction vibrations and all axial-rotation-direction vibrations, to a chassis in which the fan device is mounted.

Means for Solving the Problems

In order to achieve the above-described object, the present invention provides a fan device mounting structure including a fan device, a chassis in which the fan device is mounted, and a pair of flat springs, each of which has its one end attached to the fan device and extending outwards from the fan device and bending and has the other end attached to outside an area in which the fan device is located, wherein both opposite faces of the fan device facing each other are supported by the flat springs respectively so that the fan device is located separately from the chassis.

Advantageous Effects of Invention

According to the present invention, it is possible to provide a fan device mounting structure capable of sufficiently suppressing transmission of all translational-direction vibrations and all axial-rotation-direction vibrations, which are generated from a fan device, to a chassis in which the fan device is mounted.

BRIEF DESCRIPTION OF DRAWINGS

FIG. 3 is a front view of the fan device and its mounting structure shown in FIG. 1.

FIG. 23 is an enlarged perspective view of the right side of a fan device and its mounting structure according to Embodiment 11 of the present invention.

DESCRIPTION OF EMBODIMENTS

Next, a fan device and its mounting structure according to an embodiment of the present invention will be explained with reference to drawings. Incidentally, embodiments described below are examples given for the purpose of describing this invention, and it is not intended to limit the invention only to these embodiments. Accordingly, this invention can be utilized in various ways unless the utilizations depart from the gist of the invention.

(Embodiment 1)

Figure 1:
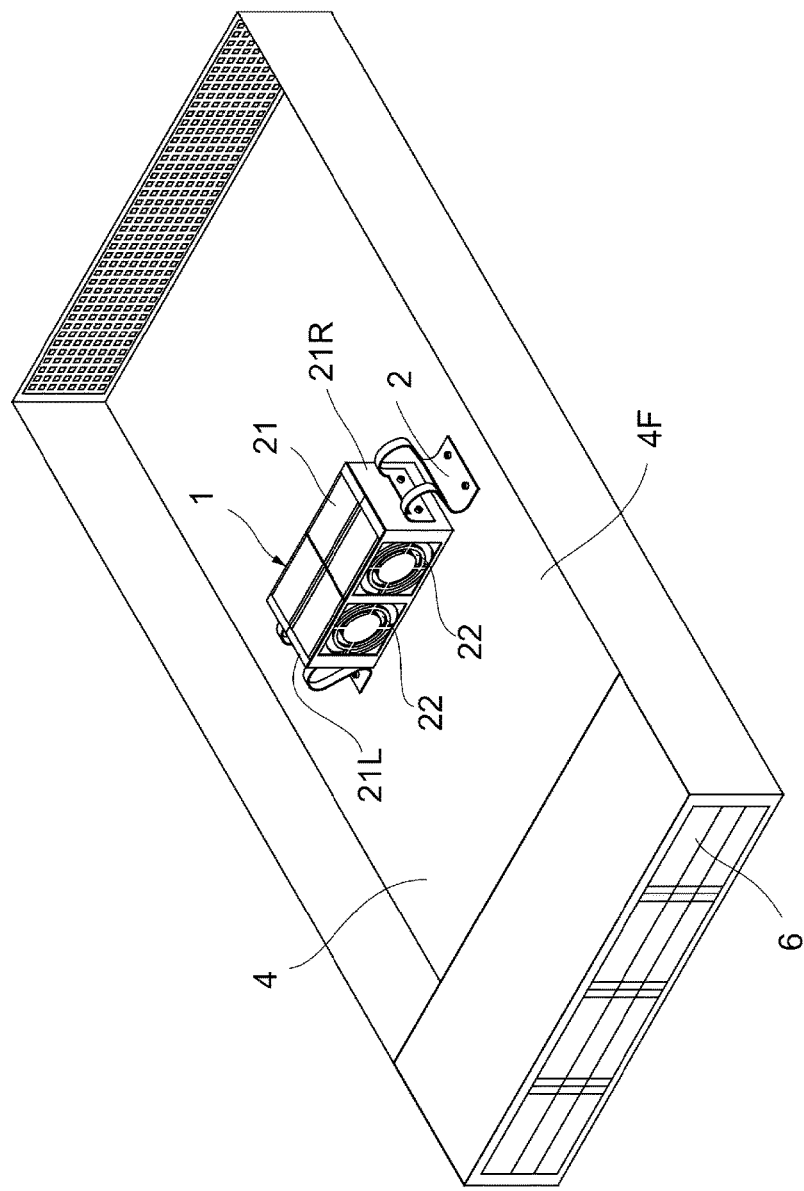
FIG. 1 is a perspective view of a state in which a fan device according to Embodiment 1 of the present invention is mounted in a chassis for electronic equipment.
Figure 2:
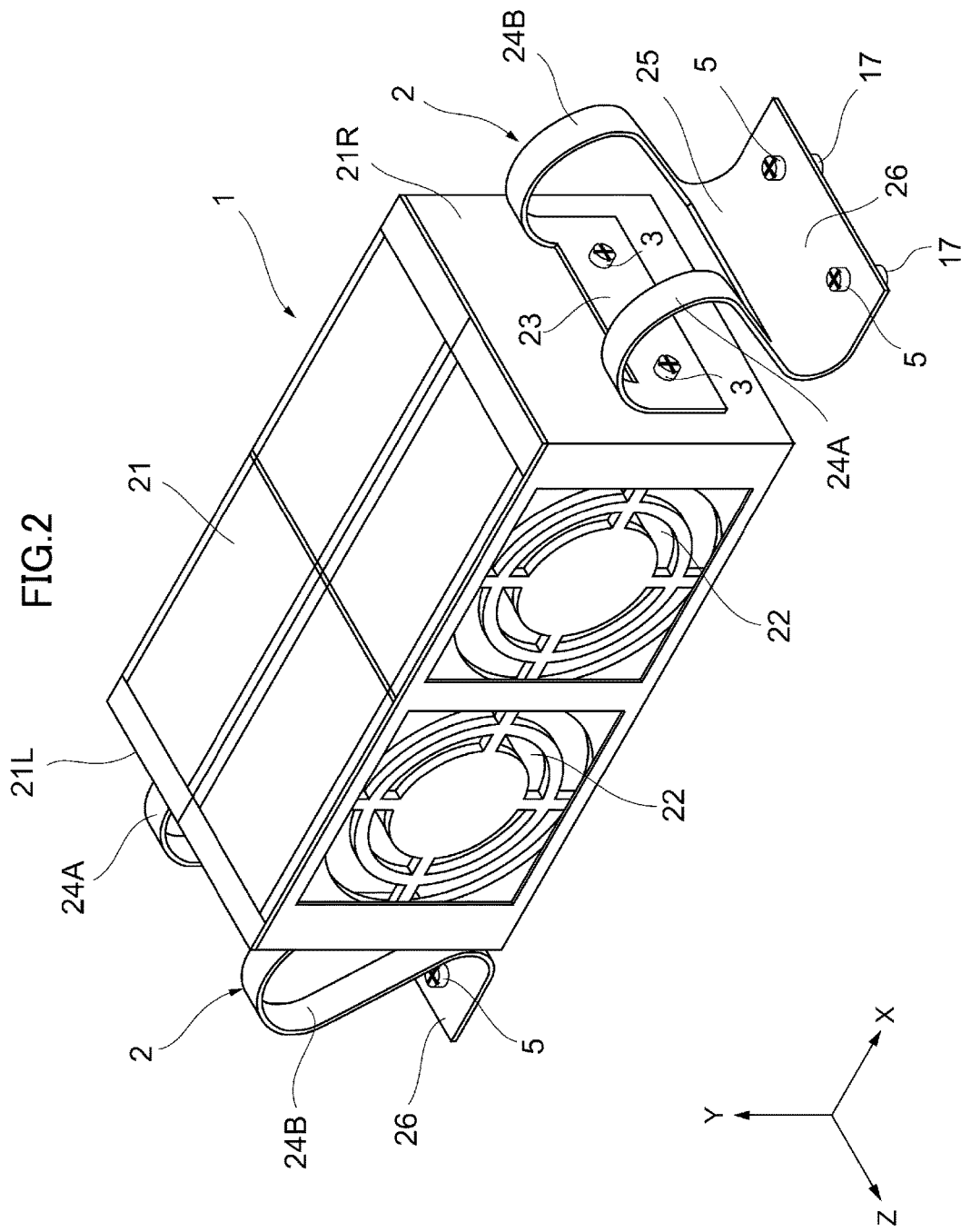
FIG. 2 is an enlarged perspective view of the fan device and its mounting structure shown in FIG. 1.
Figure 4:
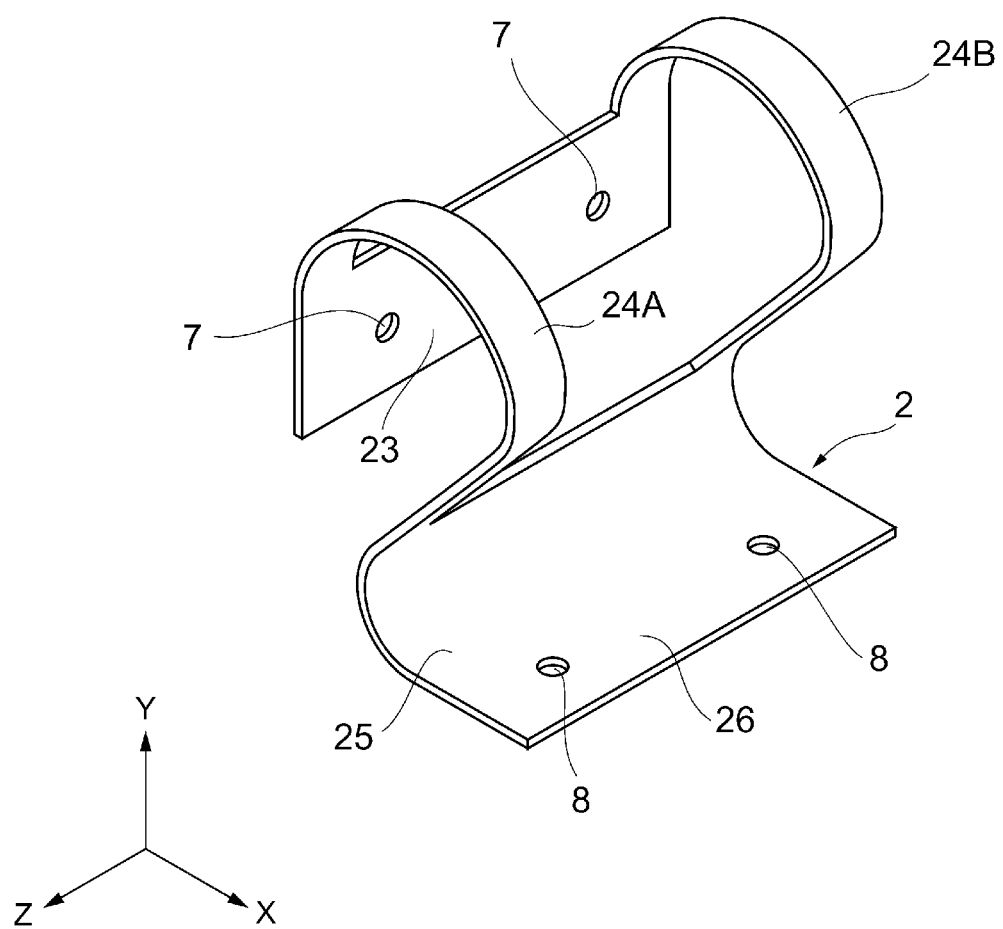
FIG. 4 is a perspective view of a flat spring for mounting the fan device shown in FIG. 1 in the chassis.
Figure 5:
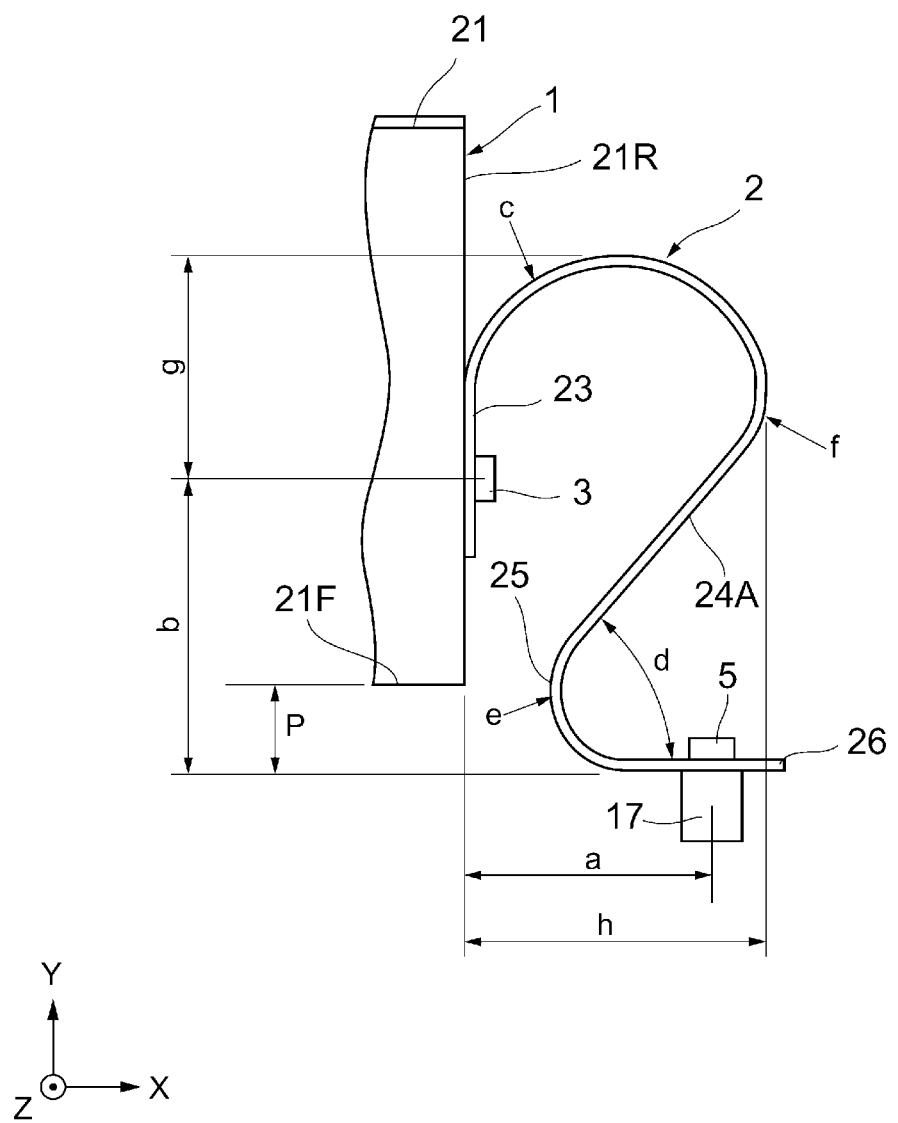
FIG. 5 is a partially-enlarged front view of the fan device and its mounting structure shown in FIG. 1.
Figure 6:
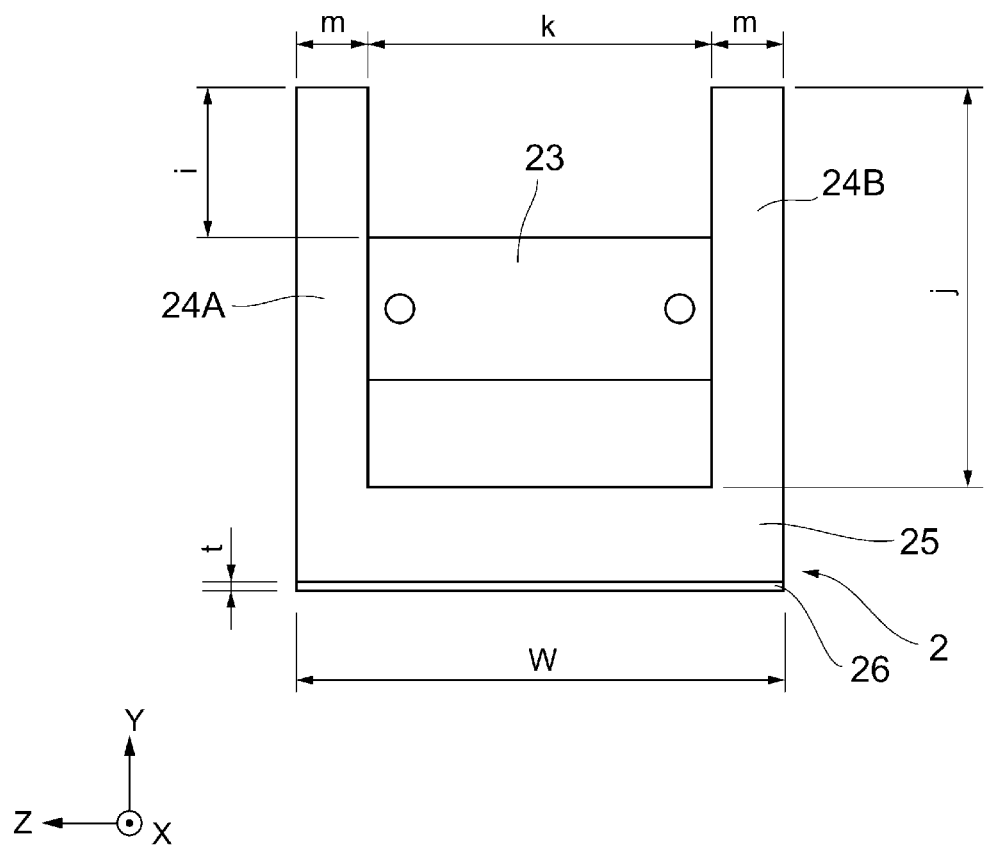
FIG. 6 is a right side view of the flat spring shown in FIG. 4.

FIG. 1 is a perspective view of a state in which a fan device according to Embodiment 1 of the present invention is mounted in a chassis for electronic equipment; FIG. 2 is enlarged perspective view of the fan device and its mounting structure shown in FIG. 1; FIG. 3 is a front view of the fan device and its mounting structure shown in FIG. 1; FIG. 4 is a perspective view of a flat spring for mounting the fan device shown in FIG. 1 in the chassis; FIG. 5 is a partially-enlarged front view of the fan device and its mounting structure shown in FIG. 1; and FIG. 6 is a right side view of the flat spring shown in FIG. 4. Incidentally, each of the above drawings illustrates the thickness, size, enlargement and reduction ratios, and other details of each component; but for ease of comprehension, they are not to scale.

As shown in FIG. 1 to FIG. 3, a fan device 1 according to Embodiment 1 is placed in, for example, a chassis 4 for electronic equipment and includes a total of four fans 22, that is, two fans 22 mounted in a serial direction relative to a flow path direction (a direction of an air stream ejected from of the fan device 1: a direction opposite a Z direction in Embodiment 1) and two fans 22 in a parallel direction relative to the flow path direction, and a fan case 21 containing those four fans 22. Incidentally, Embodiment 1 will be described about a case where four fans 22 are mounted in the fan case 21; however, the number of fans 22 is not limited to this example and the fan case 21 may be sufficient as long as it can contain one or more fans 22; and a plurality of fans 22 may be mounted in the parallel direction and/or the serial direction relative to the flow path direction or a single fan 22 may be mounted.

Hard disk drives 6 are placed upstream or downstream from the chassis 4 in the flow path direction and the hard disk drives 6 are cooled as an air stream drawn into the fan device 1 or ejected from the fan device 1 passes through the hard disk drives 6 or hits the hard disk drives 6.

One end of a flat spring 2 is attached to each of side walls 21R and 21L which are generally parallel to the flow path of the fan case 21 and the other end of the flat spring 2 is attached to a bottom face 4F of the chassis 4. Incidentally, each of the pair of flat springs 2 attached to the side walls 21R and 21L is the same flat spring 2, so that the flat spring 2 attached to the side wall 21R will be explained here.

The flat spring 2 includes, as shown in details in FIG. 2 to FIG. 6: a plate-like fan-device-side attachment part 23 (corresponding to a first attachment part of the present invention) to be attached to the side wall 21R of the fan case 21; strip-like curved parts 24A and 24B (corresponding to a first curved part of the present invention) which respectively extend continuously from both Z-direction ends of the fan-device-side attachment part 23, bend with bend radius c (inflection point c: see FIG. 5), and further bend with bend radius f (inflection point f: see FIG. 5); a chassis-side curved part 25 (corresponding to a second curved part of the present invention) whose both Z-direction ends are connected continuously to one end of the strip-like curved parts 24A and 24B, and which bends with bend radius e (inflection point e: see FIG. 5); and a plate-like chassis-side attachment part 26 (corresponding to a second attachment part of the present invention) which extends continuously from one end of the chassis-side curved part 25 and is then attached to the bottom face 4F of the chassis 4. This flat spring 2 is composed of a metal material having elasticity of appropriate hardness as a spring material such as stainless steel. Incidentally, t in FIG. 6 represents the plate thickness of the flat spring 2. Moreover, in Embodiment 1, the strip-like curved parts 24A and 24B and the chassis-side curved part 25 constitutes a curved part of the present invention.

Fan case connecting holes 7 for securely attaching the flat spring 2 to the side wall 21R of the fan case 21 are formed respectively near the Z-direction ends of the fan-device-side attachment part 23. A screw 3 is inserted into this fan case connecting hole 7 and this screw 3 threadably engages with a flat spring connecting hole (not shown) formed in the side wall 21R of the fan case 21, so that the fan-device-side attachment part 23 is securely attached to the side wall 21R. Incidentally, w in FIG. 6 represents the Z-direction length (width) of the fan-device-side attachment part 23.

The strip-like curved parts 24A and 24B have the same shape and each strip-like curved part 24A, 24B is bent with the bend radius c to form a vertex at a position with distance g from the center of the fan case connecting hole 7 in the Y direction and is then further bent with the bend radius f to form a vertex at a position with distance h from the side wall 21R in the X direction as shown in FIG. 5. Specifically speaking, when the flat spring 2 is attached to the side wall 21R, the strip-like curved parts 24A and 24B are formed to extend from the side wall 21R in the X direction, but not protrude from Y-direction ends of the fan case 21. Incidentally, referring to FIG. 6, m represents the Z-direction length (width) of the strip-like curved part 24A, 24B, k represents the distance between the strip-like curved part 24A and the strip-like curved part 24B, j represents the distance between from the vertex of the strip-like curved part 24A, 24B and the chassis-side curved part 25, and i represents the distance between the vertex of the strip-like curved part 24A, 24B and the fan-device-side attachment part 23.

The chassis-side curved part 25 is bent with the bend radius e so that the strip-like curved part 24A, 24B and the chassis-side attachment part 26 form angle d. This chassis-side curved part 25 is formed so that the flat spring 2 will not contact the side wall 21R when it is attached to the side wall 21R.

Chassis connecting holes 8 for securely attaching the flat spring 2 to the bottom face 4F of the chassis 4 are formed respectively near the Z-direction ends of the chassis-side attachment part 26. This chassis connecting hole 8 is formed so that the distance between its center to the side wall 21R becomes a when the chassis-side attachment part 26 is attached to the bottom face 4F. A screw 5 is inserted into this chassis connecting hole 8 and threadably engages with a fastener 17 which is press-fit with the bottom face 4F of the chassis 4, so that the chassis-side attachment part 26 is thereby securely attached to the bottom face 4F of the chassis 4. Incidentally, when the chassis-side attachment part 26 is attached to the bottom face 4F, the bottom face 21F of the fan case 21 is located separate from the bottom face 4F of the chassis 4 with distance p between them. Moreover, referring to FIG. 6, w represents the Z-direction length (width) of the chassis-side attachment part 26 and this width is the same as the width of the chassis-side curved part 25 in Embodiment 1.

Since the fan device 1 is attached to the chassis 4 via the flat springs 2 whose fan-device-side attachment parts 23 are securely attached respectively to the side walls 21R and 21L, which extend outwards from the fan device 1 and bend, and whose chassis-side attachment parts 26 are attached to outside the fan device located area of the bottom face 4F of the chassis 4 as described above, the flat springs 2 can absorb vibrations generated from the fan device 1 when the fan device 1 is driven. Under this circumstance, the flat spring 2 bends at inflection point c, inflection point f, and inflection point e (bends in a generally S shape as seen from the front), so that it is possible to set a long vibration transmission path connecting the fan case 21, which is a vibration transmission source, and the chassis 4 which is a vibration transmission destination. Also, since the fan case 21 does not directly contact (or is not in contact with) the chassis 4, it is possible to sufficiently suppress transmission of all translational-direction vibrations and all axial-rotation-direction vibrations generated from the fan device 1 to the chassis 4.

As one example, parameters for the flat spring 2 are $a=0.46x$, $b=0.54x$, $c=0.28x$, $d=50°$, $e=0.15x$, $f=0.15x$, $g=0.42x$, $w=0.95x$, $i=0.28x$, $j=0.76x$, $k=0.68x$, $m=0.14x$, and $t=0.01x$ where transmission path length x is a sum of a and b shown in FIG. 5 when the flat spring 2 is not used. In the case of the above-mentioned parameters, the vibration transmission path length when the flat spring 2 is used is $2.04x$.

Incidentally, these parameters are decided in consideration of, for example, the mass and natural frequency of the fan device 1, natural frequency of the chassis 4, natural frequency of the hard disk drives 6, and a mounting space and manufacturing cost of the flat springs 2 so that resonance phenomena will not be caused by the number of revolutions of the fans 22 used as much as possible.

Furthermore, Embodiment 1 has been described about the case where the screw 5 inserted into the chassis connecting hole 8 is made to threadably engage with the fastener 17 which is press-fit with the bottom face 4F of the chassis 4, thereby securely attaching the chassis-side attachment part 26 of the flat spring 2 to the bottom face 4F of the chassis 4; however, the present invention is not limited to this example and the chassis-side attachment part 26 may be securely attached by making the screw 5, which is inserted into the chassis connecting hole 8, directly threadably engage with, for example, a threaded hole formed in the bottom face 4F of the chassis 4.

Furthermore, the number of the flat springs 2 to be placed may be decided arbitrarily, for example, as two pairs or more according to, for example, the Z-direction length of the fan device 1.

(Embodiment 2)

Figure 7:
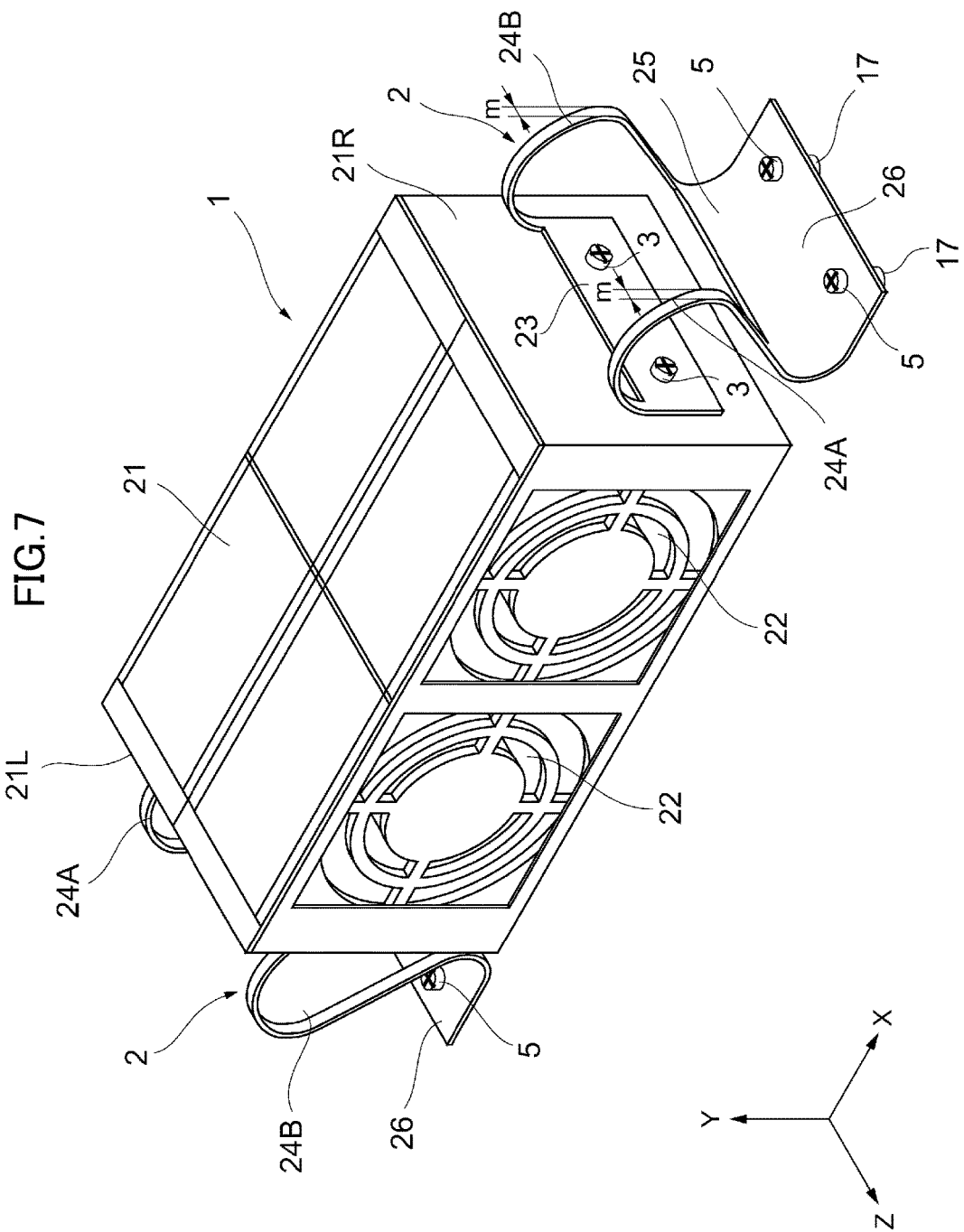
FIG. 7 is a perspective view of a fan device and its mounting structure according to Embodiment 2 of the present invention.

Next, a fan device and its mounting structure according to Embodiment 2 of the present invention will be explained with reference to the relevant drawings. FIG. 7 is a perspective view of a fan device and its mounting structure according to Embodiment 2 of the present invention. Incidentally, the same reference numerals as used in Embodiment 1 are assigned to the same elements in Embodiment 2 as those explained in Embodiment 1 and detailed explanations about them have been omitted.

The difference between the fan device mounting structure according to Embodiment 2 and the fan device mounting structure according to Embodiment 1 is the shape of the flat spring 2. Specifically speaking, the flat spring 2 according to Embodiment 2 is formed so that the Z-direction length (width) m of the strip-like curved part 24A, 24B is shorter (or narrower) than the Z-direction length (width) m of the strip-like curved part 24A, 24B of the flat spring 2 according to Embodiment 1. Incidentally, m is set as $m=0.04x$ in Embodiment 2.

Accordingly, the Z-direction length (width) of the strip-like curved part 24A, 24B is narrowed, so that this portion becomes easily distorted. So, a spring effect relative to the Z direction can be enhanced. As a result, all translational-direction and all axial-rotation-direction vibrations in the X, Y, and Z directions can be suppressed more efficiently.

(Embodiment 3)

Figure 8:
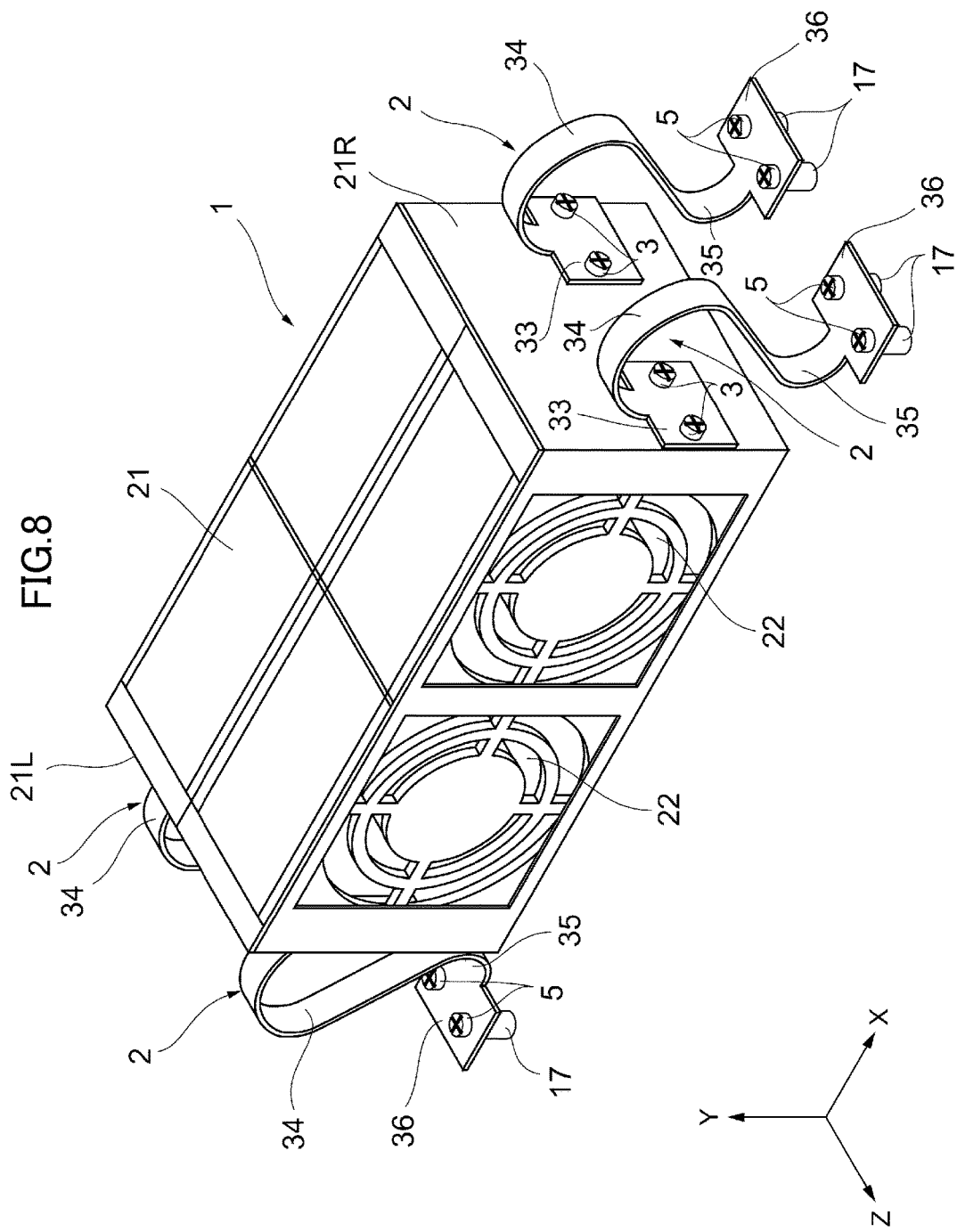
FIG. 8 is a perspective view of a fan device and its mounting structure according to Embodiment 3 of the present invention.

Next, a fan device and its mounting structure according to Embodiment 3 of the present invention will be explained with reference to the relevant drawings. FIG. 8 is a perspective view of a fan device and its mounting structure according to Embodiment 3 of the present invention. Incidentally, the same reference numerals as used in Embodiment 1 are assigned to the same elements in Embodiment 3 as those explained in Embodiment 1 and detailed explanations about them have been omitted.

The difference between the fan device mounting structure according to Embodiment 3 and the fan device mounting structure according to Embodiment 1 is the shape of the flat spring 2 and the number of the flat spring(s) 2 to be placed. Specifically speaking, the flat spring 2 according to Embodiment 3 includes, as shown in FIG. 8: a plate-like fan-device-side attachment part 33 attached to the side wall 21R of the fan case 21; a strip-like curved part 34 which extends continuously from a Z-direction central part of the fan-device-side attachment part 33, bends with bend radius c (inflection point c: see FIG. 5), and then further bends with bend radius f (inflection point f: see FIG. 5); a chassis-side curved part 35 which is formed continuously from the strip-like curved part 34 and bends with bend radius e (inflection point e: see FIG. 5); and a plate-like chassis-side attachment part 36, a Z-direction central part of which is connected continuously with one end of the chassis-side curved part 35, and which is attached to the bottom face 4F of the chassis 4.

Holes (not shown in the drawing) similar to the fan case connecting holes 7 are formed respectively near the Z-direction ends of the fan-device-side attachment part 33 and this fan-device-side attachment part 33 is securely attached to the side wall 21R by means of the screws 3 in the same manner as in Embodiment 1.

The Z-direction length (width) m of the strip-like curved part 34 is formed to be shorter (or narrower) than the length (width) of the fan-device-side attachment part 33 in the same direction and the length (width) of the chassis-side curved part 35 in the same direction is formed to be the same length (width) as the length (width) m of the strip-like curved part 34. Incidentally, in Embodiment 3, the length (width) m of the strip-like curved part 34 is the same as that of the strip-like curved part 24A, 24B as explained in Embodiment 1 and this length (width) m can be decided in consideration of, for example, the mass and natural frequency of the fan device 1, natural frequency of the chassis 4, natural frequency of the hard disk drives 6, and the mounting space and manufacturing cost of the flat springs 2 so that resonance phenomena will not be caused by the number of revolutions of the fans 22 used as much as possible.

Holes (not shown in the drawing) similar to the chassis connecting hole 8 are formed respectively near the Z-direction ends of the chassis-side attachment part 36 and this chassis-side attachment part 36 is securely attached to the bottom face 4F of the chassis 4 by means of the screws 5 in the same manner as in Embodiment 1.

The fan device mounting structure according to Embodiment 3 is equipped with a total of four flat springs 2 (two pairs), that is, two flat springs 2 placed with a specified distance between them in the Z direction and attached to each of the side walls 21R and 21L. Since each of these flat springs 2 extends outwards from the fan device 1 and bends, and its chassis-side attachment part 26 is attached to outside the fan device located area of the bottom face 4F of the chassis 4 in the same manner as in Embodiment 1, the flat springs 2 can absorb vibrations generated from the fan device 1 when the fan device 1 is driven. Under this circumstance, the flat spring 2 bends at the inflection point c, the inflection point f, and the inflection point e (bends in a generally S shape as seen from the front), so that it is possible to set a long vibration transmission path connecting the fan case 21, which is the vibration transmission source, and the chassis 4 which is the vibration transmission destination. Also, since the fan case 21 does not directly contact (or is not in contact with) the chassis 4, it is possible to sufficiently suppress transmission of all translational-direction vibrations and all axial-rotation-direction vibrations generated from the fan device 1 to the chassis 4.

Furthermore, the flat spring 2 according to Embodiment 3 is formed so that the widths of its fan-device-side attachment part 33, chassis-side curved part 35, and chassis-side attachment part 36 are narrower than the widths of those parts of the flat spring 2 explained in Embodiment 1. So, it is possible to reduce material cost and enhance space conservation. It is also possible to secure a space for placing a desired element(s) between the flat springs 2 placed side by side.

Furthermore, the number of the flat springs 2 to be placed may be decided arbitrarily, for example, as one pair or three pairs or more according to, for example, the Z-direction length of the fan device 1.

(Embodiment 4)

Figure 9:
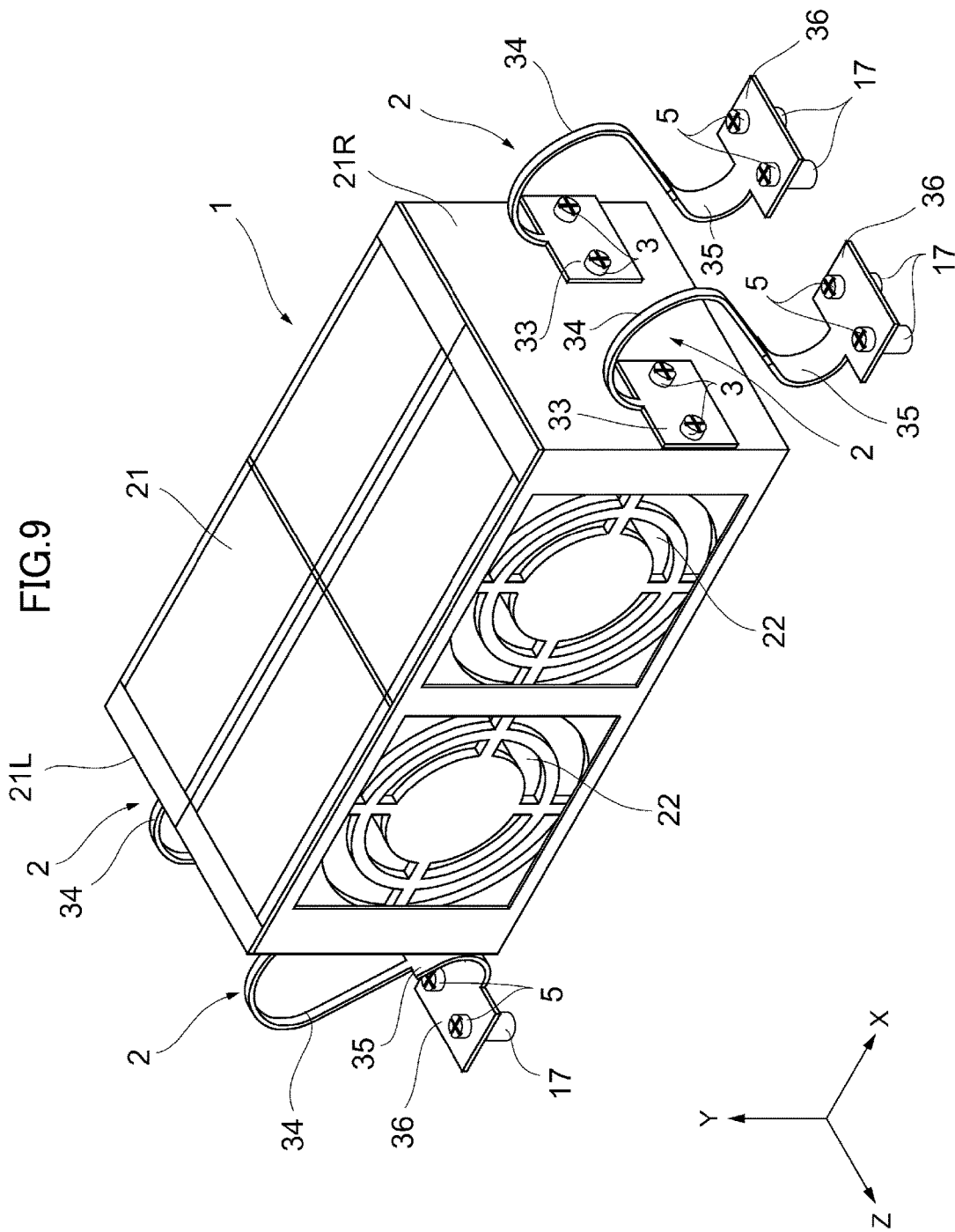
FIG. 9 is a perspective view of a fan device and its mounting structure according to Embodiment 4 of the present invention.

Next, a fan device and its mounting structure according to Embodiment 4 of the present invention will be explained with reference to the relevant drawings. FIG. 9 is a perspective view of a fan device and its mounting structure according to Embodiment 4 of the present invention. Incidentally, the same reference numerals as used in Embodiment 1 are assigned to the same elements in Embodiment 4 as those explained in Embodiment 1 and detailed explanations about them have been omitted.

The difference between the fan device mounting structure according to Embodiment 4 and the fan device mounting structure according to Embodiment 3 is the shape of the flat spring 2. Specifically speaking, the flat spring 2 according to Embodiment 4 is formed so that the Z-direction length (width) of the strip-like curved part 34 is shorter (or narrower) than the Z-direction length (width) of the strip-like curved part 34 of the flat spring 2 according to Embodiment 3. In other words, the flat spring 2 according to Embodiment 4 is formed so that the Z-direction length (width) of the strip-like curved part 34 is shorter (or narrower) than the length (width) of the chassis-side curved part 35 in the same direction.

Accordingly, the Z-direction length (width) of the strip-like curved part 34 is narrowed, so that this portion becomes easily distorted. So, the spring effect relative to the Z direction can be enhanced. As a result, all translational-direction and all axial-rotation-direction vibrations in the X, Y, and Z directions can be suppressed more efficiently.

(Embodiment 5)

Figure 10:
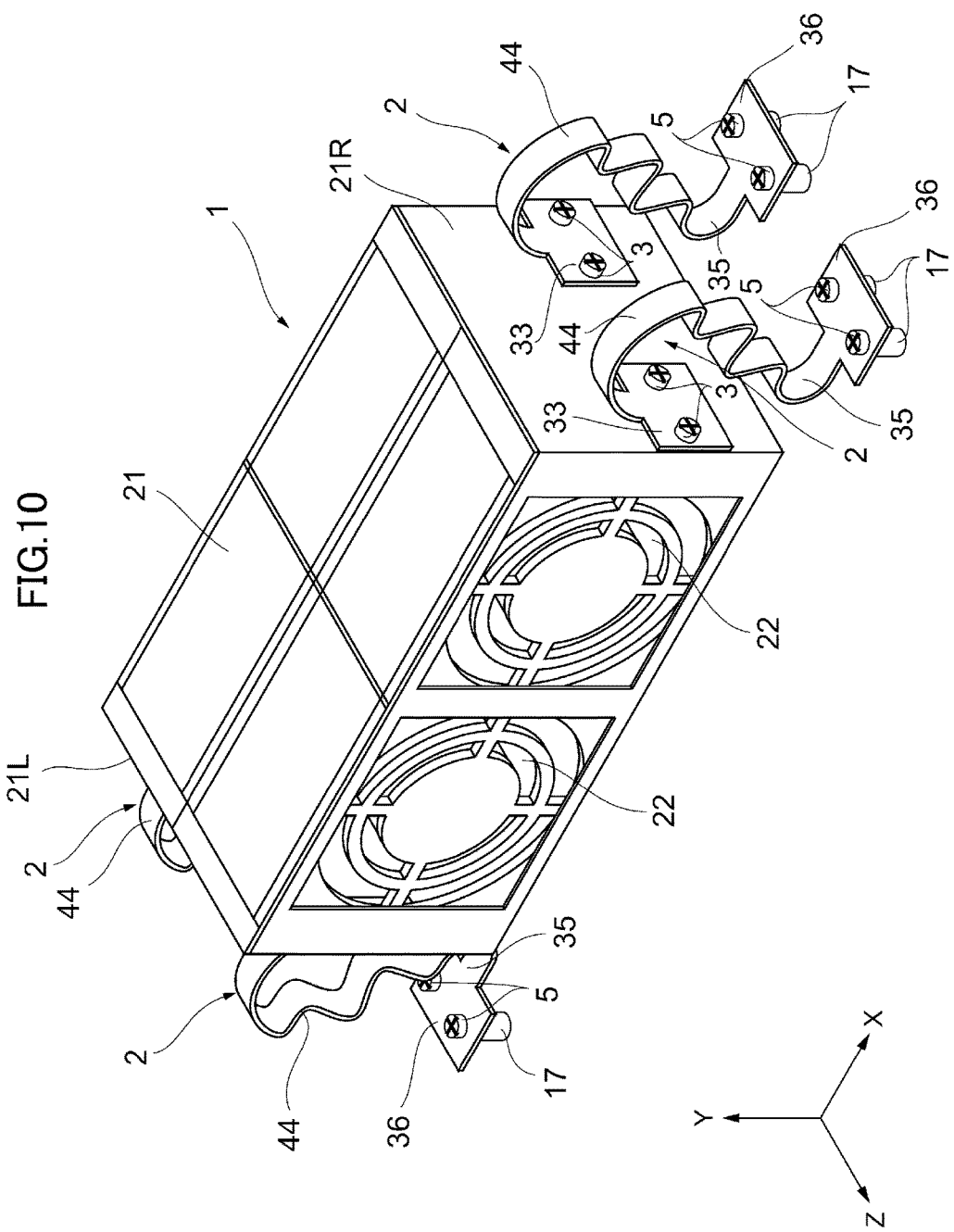
FIG. 10 is a perspective view of a fan device and its mounting structure according to Embodiment 5 of the present invention.

Next, a fan device and its mounting structure according to Embodiment 5 of the present invention will be explained with reference to the relevant drawings. FIG. 10 is a perspective view of a fan device and its mounting structure according to Embodiment 5 of the present invention. Incidentally, the same reference numerals as used in Embodiment 3 are assigned to the same elements in Embodiment 5 as those explained in Embodiment 3 and detailed explanations about them have been omitted.

The difference between the fan device mounting structure according to Embodiment 5 and the fan device mounting structure according to Embodiment 3 is the shape of the flat spring 2. Specifically speaking, a strip-like curved part 44 of the flat spring 2 according to Embodiment 5 is formed in a bellows shape, so that it is possible to efficiently increase inflection points of the strip-like curved part 44 and set a much longer vibration transmission path connecting the fan case 21, which is the vibration transmission source, and the chassis 4 which is the vibration transmission destination. Therefore, it is possible to more sufficiently suppress transmission of all translational-direction vibrations and all axial-rotation-direction vibrations generated from the fan device 1 to the chassis 4.

Incidentally, this bellows shape can also be applied to the strip-like curved parts 24A and 24B of the flat spring 2 having the structures described in Embodiments 1 and 2.

(Embodiment 6)

Figure 11:
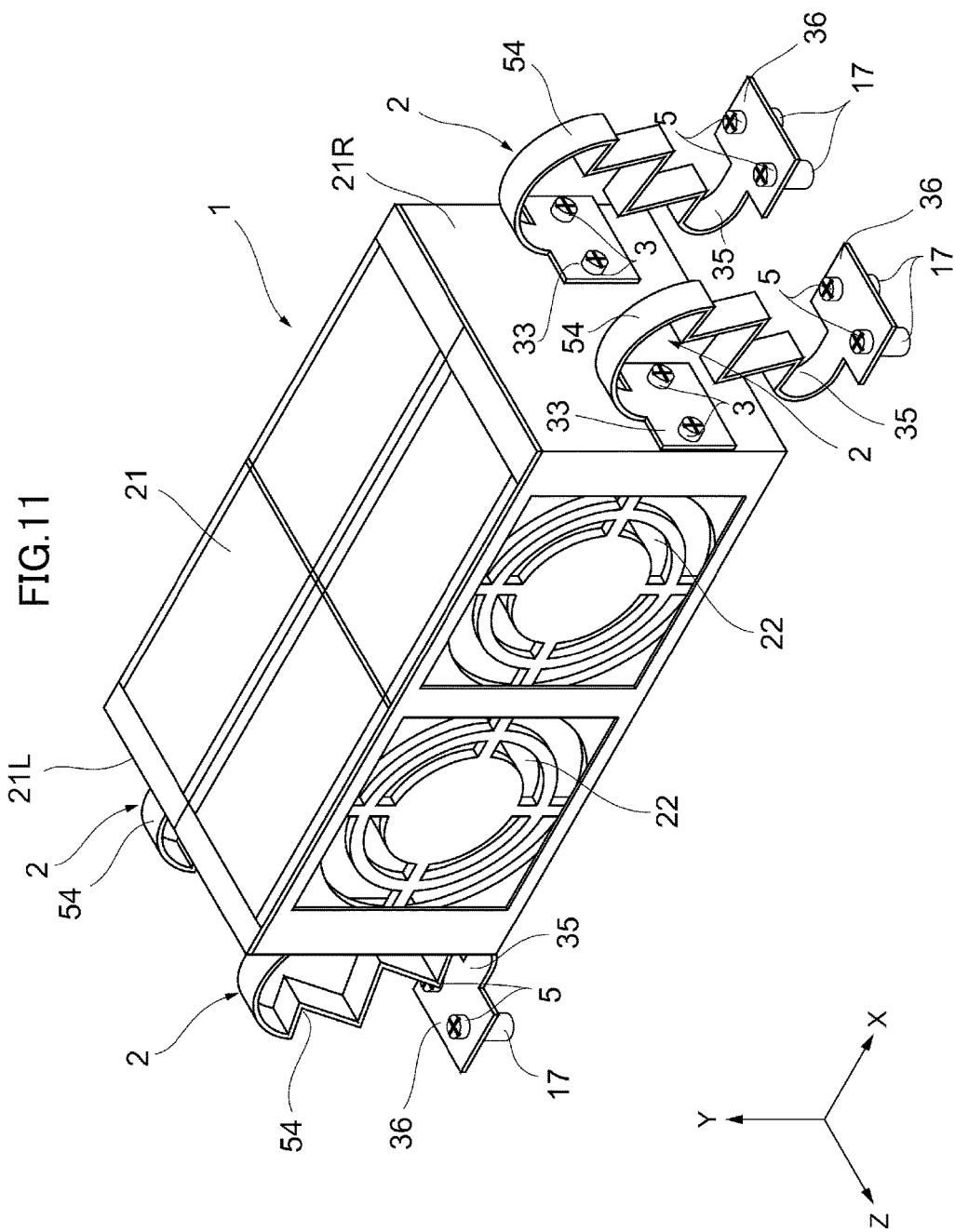
FIG. 11 is a perspective view of a fan device and its mounting structure according to Embodiment 6 of the present invention.

Next, a fan device and its mounting structure according to Embodiment 6 of the present invention will be explained with reference to the relevant drawings. FIG. 11 is a perspective view of a fan device and its mounting structure according to Embodiment 6 of the present invention. Incidentally, the same reference numerals as used in Embodiment 5 are assigned to the same elements in Embodiment 6 as those explained in Embodiment 5 and detailed explanations about them have been omitted.

The difference between the fan device mounting structure according to Embodiment 6 and the fan device mounting structure according to Embodiment 5 is the shape of the flat spring 2. Specifically speaking, with the flat spring 2 according to Embodiment 6, the bellows shape of the strip-like curved part 44 is formed by folding the strip-like curved part 44 instead of bending it. Regarding this bellows shape as in Embodiment 5, it is possible to set a much longer vibration transmission path connecting the fan case 21, which is the vibration transmission source, and the chassis 4 which is the vibration transmission destination. Therefore, it is possible to further sufficiently suppress transmission of all translational-direction vibrations and all axial-rotation-direction vibrations generated from the fan device 1 to the chassis 4.

Incidentally, it is a matter of course that this bellows shape can also be applied to the strip-like curved parts 24A and 24B of the flat spring 2 having the structures described in Embodiments 1 and 2.

(Embodiment 7)

Figure 12:
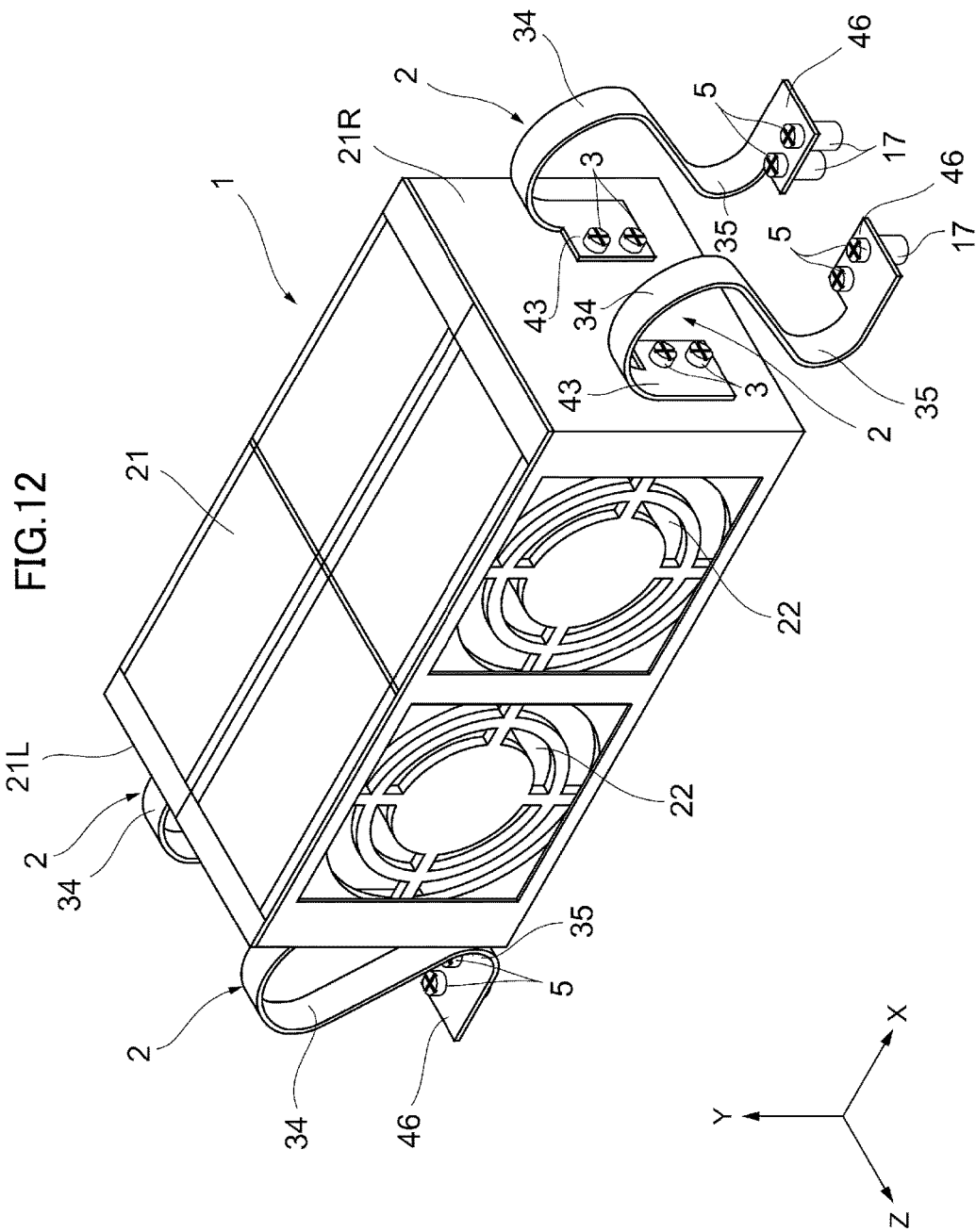
FIG. 12 is a perspective view of a fan device and its mounting structure according to Embodiment 7 of the present invention.

Next, a fan device and its mounting structure according to Embodiment 7 of the present invention will be explained with reference to the relevant drawings. FIG. 12 is a perspective view of a fan device and its mounting structure according to Embodiment 7 of the present invention. Incidentally, the same reference numerals as used in Embodiment 3 are assigned to the same elements in Embodiment 7 as those explained in Embodiment 3 and detailed explanations about them have been omitted.

The difference between the fan device mounting structure according to Embodiment 7 and the fan device mounting structure according to Embodiment 3 is the shape of the flat spring 2. Specifically speaking, the flat spring 2 according to Embodiment 7 is formed so that Z-direction lengths (widths) of its fan-device-side attachment part 43 and chassis-side attachment part 46 are shorter (or narrower) than the Z-direction lengths (widths) of the fan-device-side attachment part 33 and the chassis-side attachment part 36 according to Embodiment 3.

In this way, it is possible to reduce material cost and enhance space conservation by setting the Z-direction lengths (widths) of its fan-device-side attachment part 43 and chassis-side attachment part 46 shorter (or narrower) than the Z-direction lengths (width) of the fan-device-side attachment part 33 and the chassis-side attachment part 36. It is also possible to secure a space for placing a desired element(s) between the flat springs 2 placed side by side.

Incidentally, it is a matter of course that the shapes of the fan-device-side attachment part 33 and the chassis-side attachment part 36 can also be applied to the flat springs 2 having the structures described in Embodiments 5 and 6.

(Embodiment 8)

Figure 13:
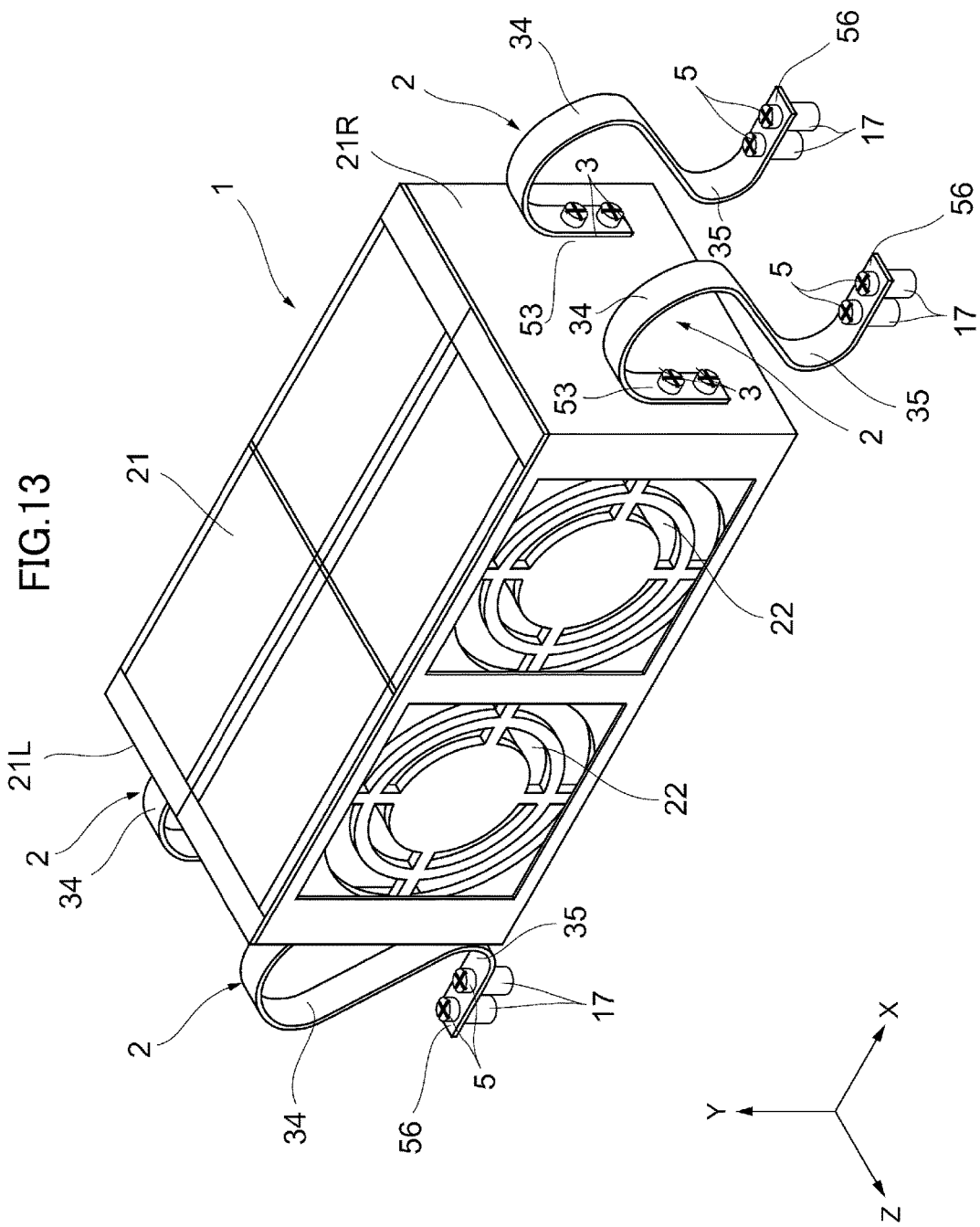
FIG. 13 is a perspective view of a fan device and its mounting structure according to Embodiment 8 of the present invention.

Next, a fan device and its mounting structure according to Embodiment 8 of the present invention will be explained with reference to the relevant drawings. FIG. 13 is a perspective view of a fan device and its mounting structure according to Embodiment 8 of the present invention. Incidentally, the same reference numerals as used in Embodiment 3 are assigned to the same elements in Embodiment 8 as those explained in Embodiment 3 and detailed explanations about them have been omitted.

The difference between the fan device mounting structure according to Embodiment 8 and the fan device mounting structure according to Embodiment 3 is the shape of the flat spring 2. Specifically speaking, the flat spring 2 according to Embodiment 8 is formed so that a fan-device-side attachment part 53, the strip-like curved part 34, the chassis-side curved part 35, and a chassis-side attachment part 56 have the same Z-direction length (width).

In this way, it is possible to reduce material cost and enhance space conservation by setting the same Z-direction length (width) of the flat spring 2 through its entire length. It is also possible to secure a space for placing a desired element(s) between the flat springs 2 placed side by side.

(Embodiment 9)

Figure 14:
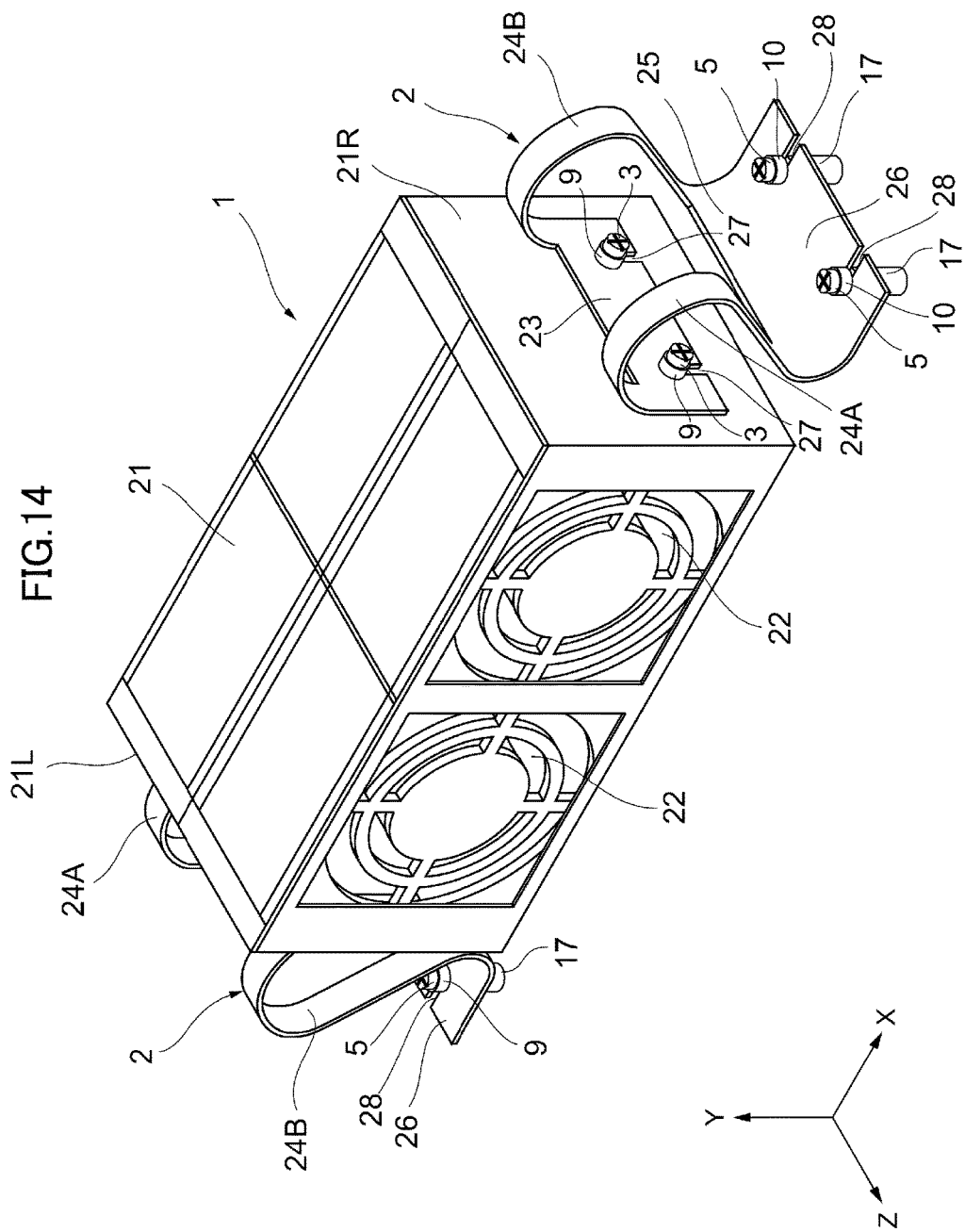
FIG. 14 is a perspective view of a fan device and its mounting structure according to Embodiment 9 of the present invention.
Figure 15:
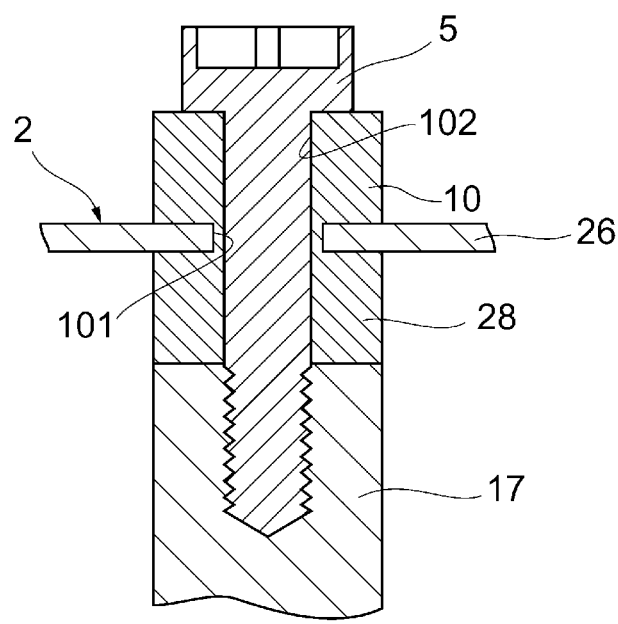
FIG. 15 is a partially-enlarged sectional view of the mounting structure shown in FIG. 14.
Figure 16:
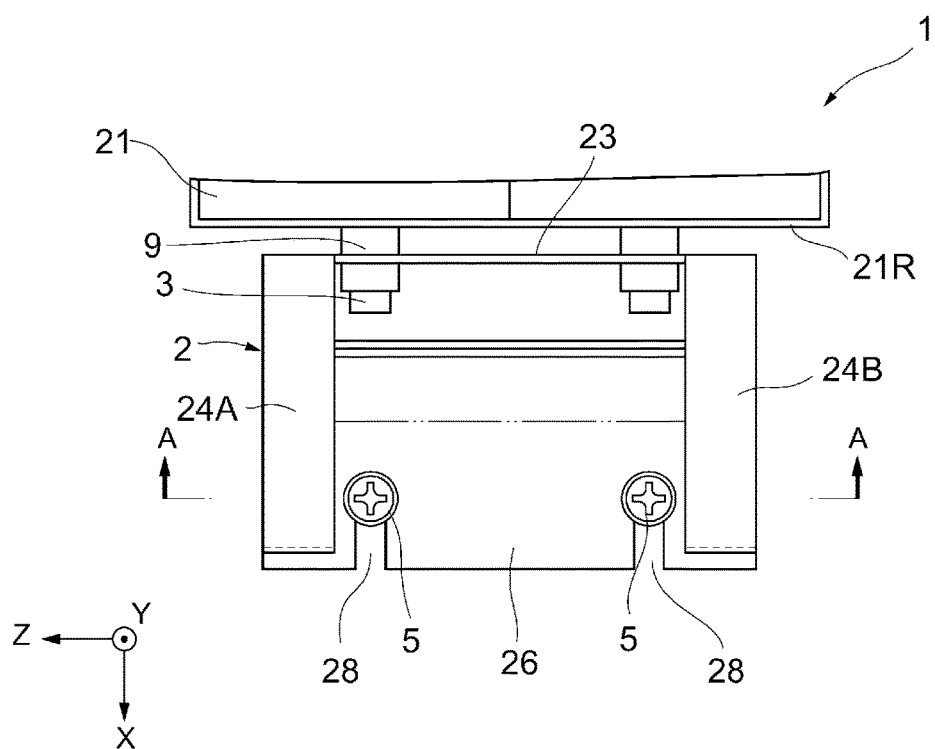
FIG. 16 is a plan view showing part of the fan device and its mounting structure shown in FIG. 14.
Figure 17:
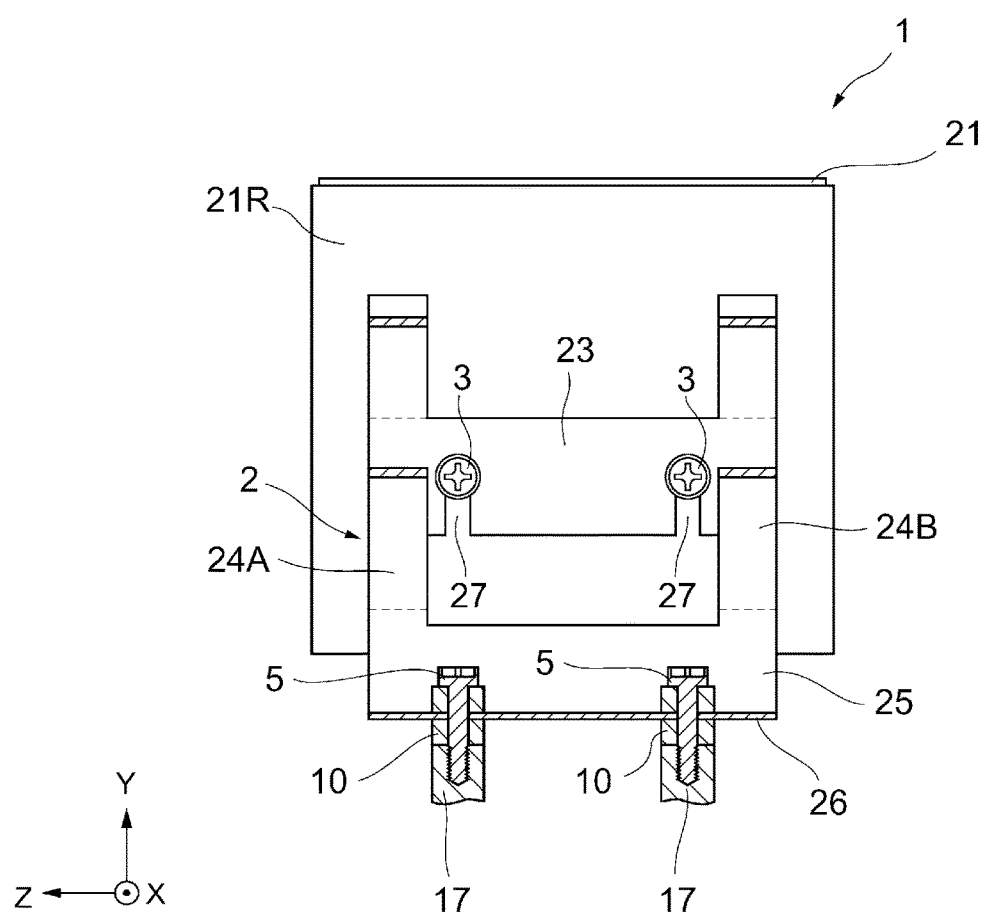
FIG. 17 is a sectional view taken along line A-A in FIG. 16.
Figure 18:
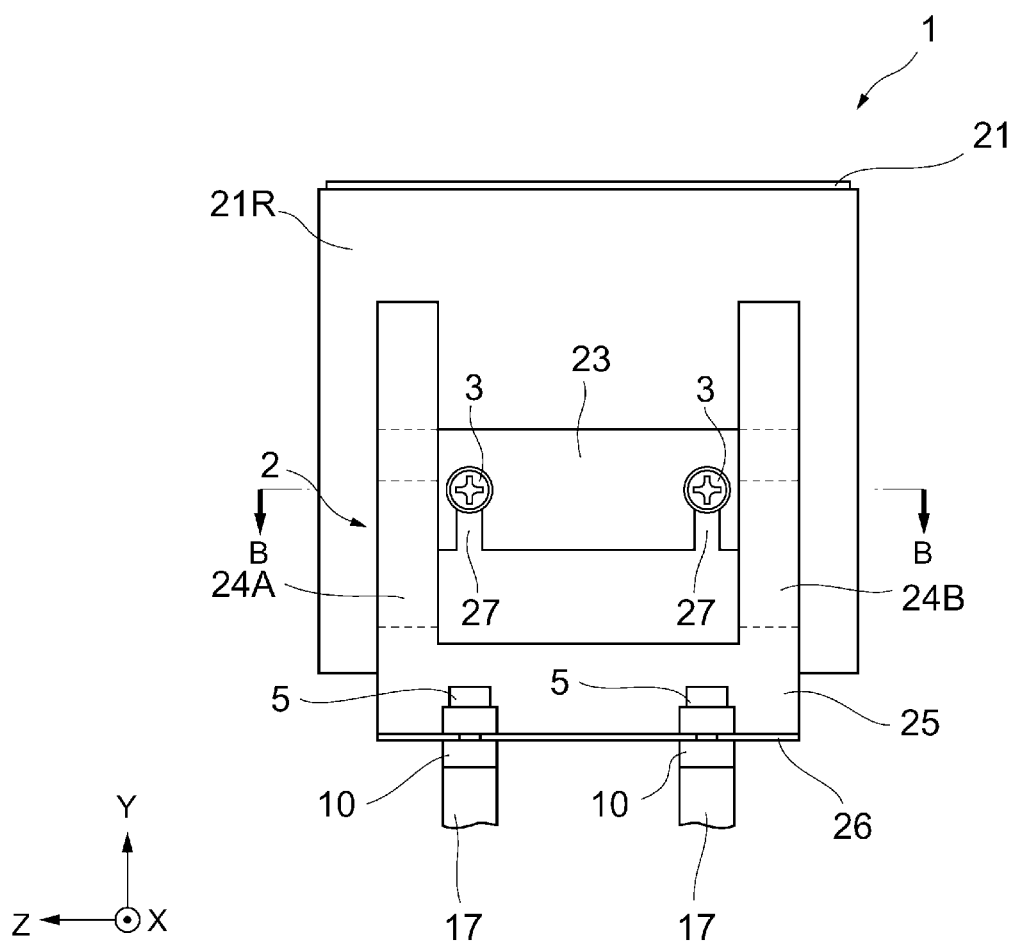
FIG. 18 is a right side view of the fan device and its mounting structure shown in FIG. 14.
Figure 19:
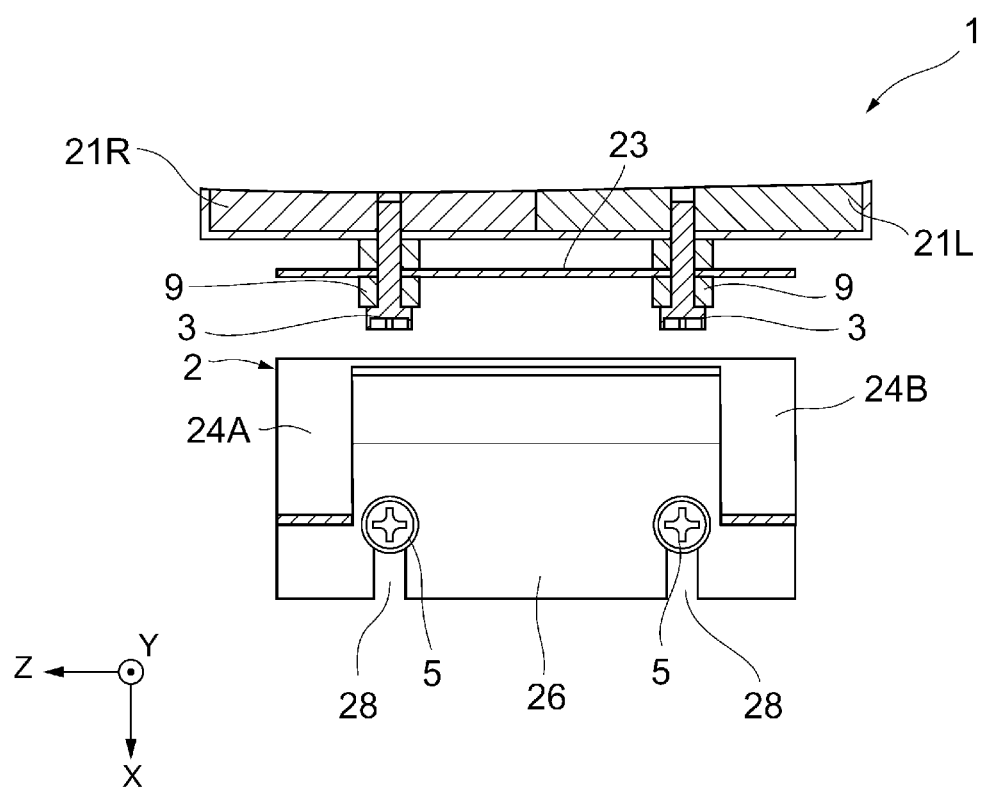
FIG. 19 is a sectional view taken along line B-B shown in FIG. 18.

Next, a fan device and its mounting structure according to Embodiment 9 of the present invention will be explained with reference to the relevant drawings. FIG. 14 is a perspective view of a fan device and its mounting structure according to Embodiment 9 of the present invention; FIG. 15 is a partially-enlarged sectional view of the mounting structure shown in FIG. 14; FIG. 16 is a plan view showing part of the fan device and its mounting structure shown in FIG. 14; FIG. 17 is a sectional view taken along line A-A in FIG. 16; FIG. 18 is a right side view of the fan device and its mounting structure shown in FIG. 14; and FIG. 19 is a sectional view taken along line B-B shown in FIG. 18. Incidentally, the same reference numerals as used in Embodiment 1 are assigned to the same elements in Embodiment 9 as those explained in Embodiment 1 and detailed explanations about them have been omitted.

The difference between the fan device mounting structure according to Embodiment 9 and the fan device mounting structure according to Embodiment 1 is the shape of the flat spring 2E. Specifically speaking, as shown in FIG. 14 to FIG. 19, a notch(es) 27 for allowing the fan case connecting hole 7 to be open to the outside in a direction perpendicular to the screw inserting direction is formed in the fan-device-side attachment part 23 of the flat spring 2 according to Embodiment 9 and a notch(es) 28 for allowing the chassis connecting hole 8 to be connected to the outside in a direction perpendicular to the screw inserting direction is formed in the chassis-side attachment part 26.

Moreover, a cylindrical bush 9 (corresponding to an elastic member of the present invention) is placed at the position where the fan case connecting hole 7 in the fan-device-side attachment part 23 is formed, so as to hold both faces of the fan-device-side attachment part 23. Furthermore, a cylindrical bush 10 is placed at the position where the chassis connecting hole 8 in the chassis-side attachment part 26 is formed, so as to hold both faces of the chassis-side attachment part 26. These bushes 9 and 10 can be made of a material different from that of the flat spring 2, for example, an elastic material such as rubber or resin.

Incidentally, since the bushes 9 and 10 have the same shape, the bush 10 will be explained here. Regarding the bush 10, a groove 101 having generally the same width as the plate thickness of the chassis-side attachment part 26 is formed in a central part of the bush 10 in a shaft center direction and around the outside surface of the bush 10 as shown in FIG. 15. Moreover, a hole 102 into which the screw (or the screw 3 in a case of the bush 9) can be inserted is formed through and inside the bush 10. This bush 10 is inserted at a position where the notch 28, the chassis connecting hole 8, and the hole 102 match each other. Then, the chassis-side attachment part 26 is securely attached to the bottom face 4F of the chassis 4 by having the screw 5 inserted into the hole 102 and the chassis connecting hole 8 engage with the fastener 17. Incidentally, the bush 9 is also inserted from the notch 27 and attached to the fan-device-side attachment part 23 in the same manner.

Since the fan device mounting structure according to Embodiment 9 can obtain a vibration suppressing effect by elastic force of the bushes 9 and 10 in addition to the vibration suppressing effect of the flat spring 2, it is possible to more reliably suppress transmission of the vibrations generated from the fan device 1 to the chassis 4.

Incidentally, the bushes 9 and 10 may be made of an elastic material different from that of the flat spring 2 and its hardness, thickness, size, and so on are decided in consideration of, for example, the mass and natural frequency of the fan device 1, natural frequency of the chassis 4, natural frequency of the hard disk drives 6, and the mounting space and manufacturing cost of the flat springs 2 so that resonance phenomena will not be caused by the number of revolutions of the fans 22 used as much as possible.

Furthermore, it is a matter of course that the bushes 9 and 10 can also be applied to the flat springs 2 explained in other embodiments.

(Embodiment 10)

Figure 20:
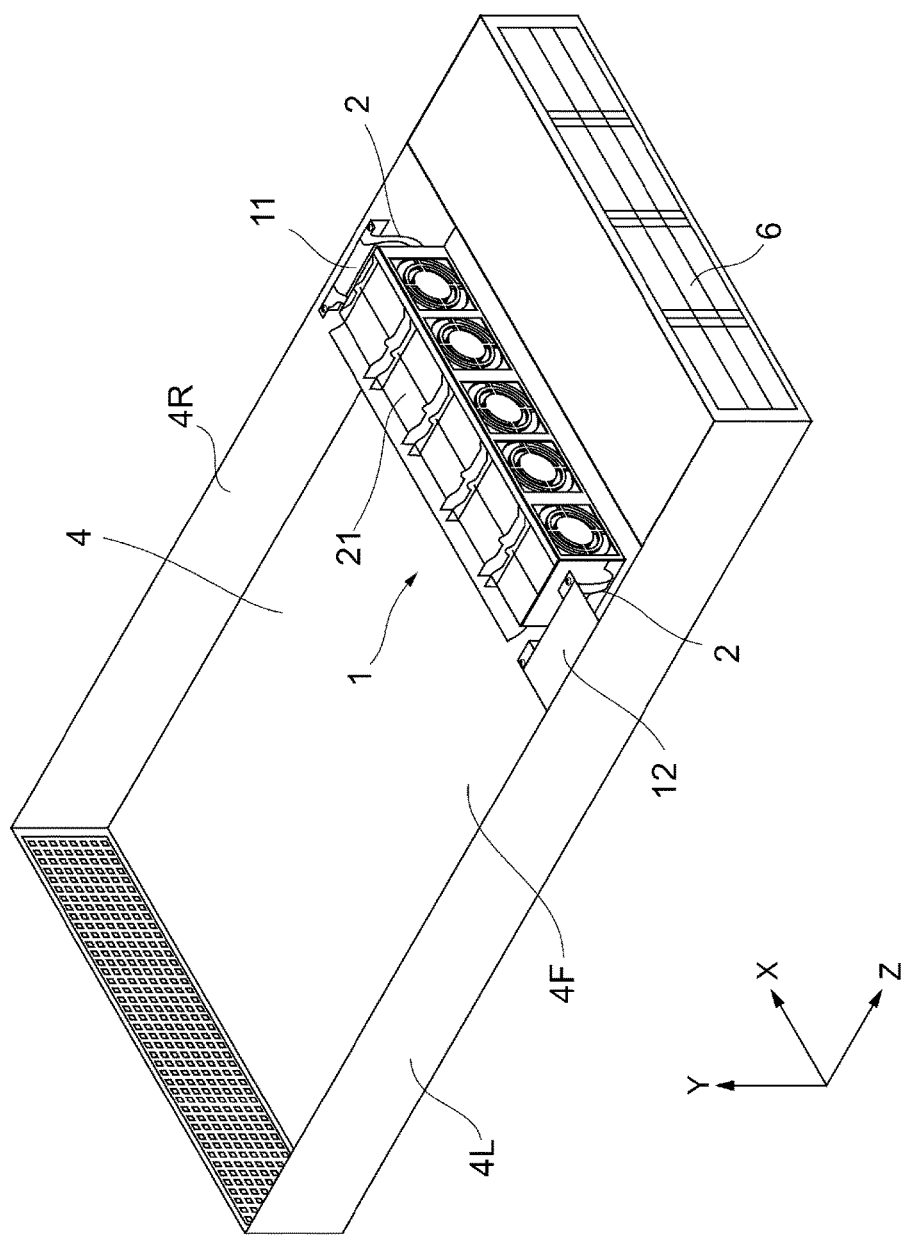
FIG. 20 is a perspective view of a state in which a fan device according to Embodiment 10 of the present invention is mounted in a chassis for electronic equipment.
Figure 21:
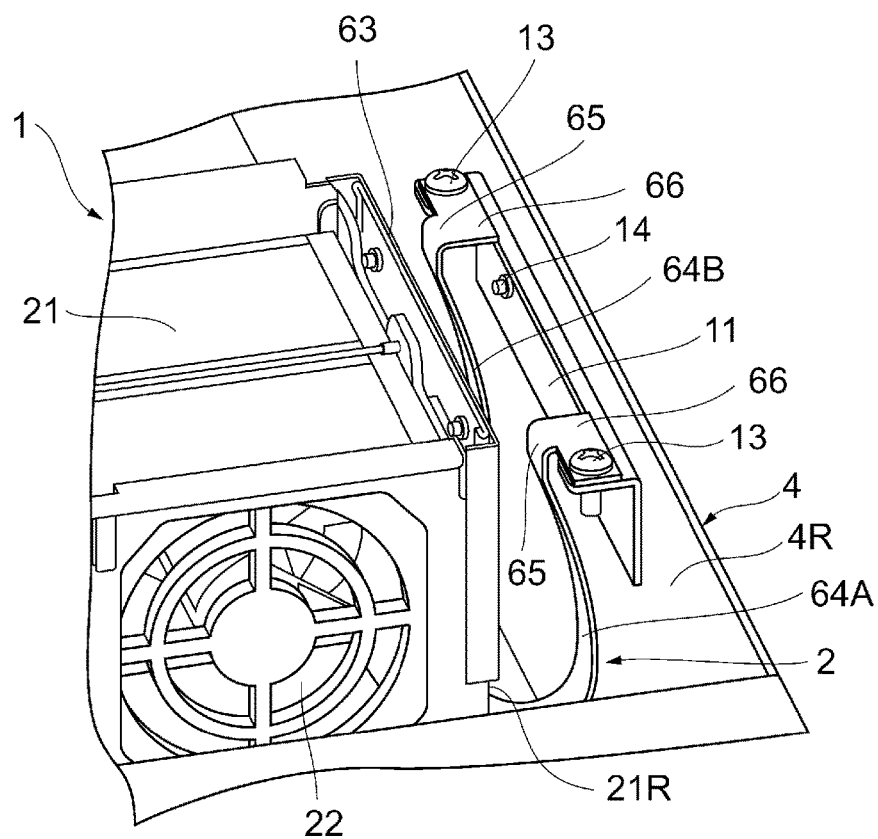
FIG. 21 is an enlarged perspective view of the right side of the fan device and its mounting structure shown in FIG. 20.
Figure 22:
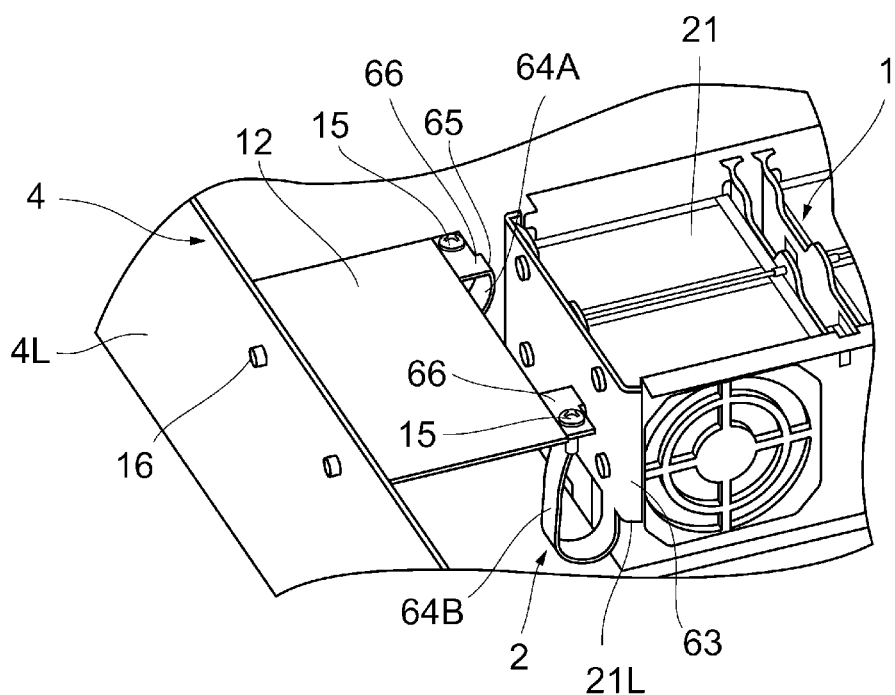
FIG. 22 is an enlarged perspective view of the left side of the fan device and its mounting structure shown in FIG. 20.

Next, a fan device and its mounting structure according to Embodiment 10 of the present invention will be explained with reference to the relevant drawings. FIG. 20 is a perspective view of a state in which a fan device according to Embodiment 10 of the present invention is mounted in a chassis for electronic equipment; FIG. 21 is an enlarged perspective view of the right side of the fan device and its mounting structure shown in FIG. 20; and FIG. 22 is an enlarged perspective view of the left side of the fan device and its mounting structure shown in FIG. 20. Incidentally, the same reference numerals as used in Embodiment 1 are assigned to the same elements in Embodiment 10 as those explained in Embodiment 1 and detailed explanations about them have been omitted.

The differences between the fan device mounting structure according to Embodiment 10 and the fan device mounting structure according to Embodiment 1 are the placement of five fan devices 1 in the X direction and two fan devices 1 in the Z direction, the shape of the flat spring 2, and the other end of the flat spring 2 being securely attached to each of the side walls 4R and 4L of the chassis 4 via a intermediately element 11, 12.

With the chassis 4 according to Embodiment 10, the intermediately element 11 is fastened by a screw 14 to the inside of one X-direction side wall 4R and the intermediately element 12 is fastened by a screw 16 to the inside of the other side wall 4L. These intermediately elements 11 and 12 extend towards inside the chassis 4 and chassis attachment parts 66 of the flat spring 2 are fastened by screws 13. Specifically speaking, this intermediately element 11, 12 exists between the chassis-side attachment part 66 of the flat spring 2 and the side wall 4R, 4L of the chassis 4 and serves a role to fill (or intermediate) the gap between them, so that the length of the part extending towards inside the chassis 4 varies depending on the distance between them, but the basic structure is the same.

Incidentally, since a pair of flat springs 2 attached to the side walls 21R and 21L are the same flat spring 2 as used in Embodiment 1, the flat spring 2 attached to the side wall 21R will be explained here.

The flat spring 2 includes, as shown in FIG. 20 to FIG. 22: a plate-like fan-device-side attachment part 63 attached to the side wall 21R of the fan case 21; strip-like curved parts 64A and 64B which extend continuously from both Z-direction ends of the fan-device-side attachment part 63 towards the bottom face 4F of the chassis 4 respectively and bend in a generally U shape; a chassis-side curved part 65, both Z-direction ends of which are connected continuously to one end of the strip-like curved parts 64A and 64B, and which bends in a generally L shape; and a plate-like chassis-side attachment part 66 which extends continuously from one end of the chassis-side curved part 65 and is attached to the intermediately element 11.

The fan-device-side attachment part 63 is fastened to the side wall 21R by screws in the same manner as the fan-device-side attachment part 23 according to Embodiment 1.

The strip-like curved parts 64A and 64B have the same shape and are formed so that the flat spring 2 will not contact the chassis 4 when it supports the fan device 1. Incidentally, in Embodiment 10, the Z-direction length (width) of the strip-like curved part 64A, 64B is the same as that of the strip-like curved part 24A, 24B as explained in Embodiment 1 and this length (width) m can be decided in consideration of, for example, the mass and natural frequency of the fan device 1, natural frequency of the chassis 4, natural frequency of the hard disk drives 6, and the mounting space and manufacturing cost of the flat springs 2 so that resonance phenomena will not be caused by the number of revolutions of the fans 22 used as much as possible.

The chassis-side curved part 65 is formed continuously at the top end of each strip-like curved part 64A, 64B and has the same Z-direction length (width) as that of each strip-like curved part 64A, 64B.

The chassis-side attachment part 66 is formed continuously at the top end of each chassis-side curved part 65 and has a Z-direction length (width) longer than that of the chassis-side curved part 65. This chassis-side attachment part 66 has a chassis connecting hole (not shown) for securely attaching the flat spring 2 to the intermediately element 11 and the inserted screw 13 threadably engages with a thread hole (not shown) formed in the intermediately element 11, thereby securely attaching the flat spring 2 to the side wall 4R of the chassis 4 via the intermediately element 11.

Since the fan device 1 is attached to the side walls 4R and 4L of the chassis 4 as described above via the flat spring 2, whose fan-device-side attachment part 63 is securely attached to each side wall 21R, 21L, which extends towards outside the fan device 1 and bends, and whose chassis-side attachment part 66 is attached to outside the fan device located area of the chassis 4, the flat spring 2 can absorb vibrations generated from the fan device 1 when the fan device 1 is driven. Under this circumstance, since the flat spring 2 has a plurality of inflection points, it is possible to set a long vibration transmission path connecting the fan case 21, which is the vibration transmission source, and the chassis 4 which is the vibration transmission destination. Also, since the fan case 21 does not directly contact (or is not in contact with) the chassis 4, it is possible to sufficiently suppress transmission of all translational-direction vibrations and all axial-rotation-direction vibrations generated from the fan device 1 to the chassis 4.

Incidentally, the intermediately elements 11 and 12 do not necessarily have to be provided depending on the distance between the chassis-side attachment part 66 and the side wall 4R, 4L of the chassis 4 or only either one of the intermediately elements 11 and 12 may be provided.

(Embodiment 11)

Next, a fan device and its mounting structure according to Embodiment 11 of the present invention will be explained with reference to the relevant drawings. FIG. 23 is an enlarged perspective view of the right side of a fan device and its mounting structure according to Embodiment 11 of the present invention. Incidentally, the same reference numerals as used in Embodiment 1 are assigned to the same elements in Embodiment 11 as those explained in Embodiment 1 and detailed explanations about them have been omitted.

The difference between the fan device mounting structure according to Embodiment 11 and the fan device mounting structure according to Embodiment 10 is the shape of the flat spring 2. Specifically speaking, the flat spring 2 according to Embodiment 11 is formed as shown in FIG. 23 that instead of placing the intermediately element 11, the shape of a chassis-side attachment part 76 is formed by integrating the intermediately element 11 with the chassis-side attachment part 66 according to Embodiment 10.

Incidentally, the flat spring 2 may be formed so that instead of placing the relay element 12, the shape of the chassis-side attachment part 76 may be formed by integrating the relay element 12 with the chassis-side attachment part 66 according to Embodiment 10.

Furthermore, the aforementioned Embodiments 1 to 11 have described the case where the fan device 1 equipped with the fans 22 in the fan case 21 is mounted in the chassis 4; however, the present invention is not limited to this example and the fans 22 may not be mounted in the fan case 21 and the fans 22 may be directly attached to the chassis 4 via the flat springs 2 depending on, for example, the shape and type of the fans 22.

Furthermore, the fan device 1 can be attached to a desired position such as a ceiling face of the chassis 4 besides the bottom face 4F or the side walls 4R and 4L of the chassis 4.

REFERENCE SIGNS LIST

1 fan device; 2 flat spring; 4 chassis; 4F bottom face; 4L, 4R side walls; 9 bush; 21 fan case; 21L, 21R side walls; 22 fans; 23, 33, 43, 53, 63 fan-device-side attachment parts; 24A, 24B, 34, 44, 64A, 64B strip-like curved parts; 25, 35, 65 chassis-side curved parts; 26, 36, 46, 56, 66 chassis-side attachment parts.

The invention claimed is:

1. A fan device mounting structure comprising:
   a fan device;
   a chassis in which the fan device is mounted; and
   a pair of flat springs, each flat spring having a first end attached to the fan device and bent to extend outwards from the fan device, and having a second end attached to outside an area in which the fan device is located,
   wherein opposing faces of the fan device facing each other are respectively supported by the flat springs so that the fan device is located separately from the chassis,
   wherein each of the flat springs is bent in a U-shape as viewed from a front view of the fan device.

2. The fan device mounting structure according to claim 1, wherein the flat spring includes:
   a first attachment part attached to the fan device,
   a second attachment part attached to the chassis, and
   a curved part extending from the first attachment part and lying between the first attachment part and the second attachment part and having a plurality of deflection points,
   wherein the curved part includes:
   a first curved part extending from the first attachment part, and
   a second curved part lying between the first curved part and the second attachment part,
   wherein the first curved part is provided in plurality and a number of the first curved part is two, and each of the first curved parts is composed of a strip-like curved part having a width narrower than a width of the first attachment part, and one first curved part extends from one width-direction end part of the first attachment part and another first curved part extends from another width-direction end part of the first attachment part, and
   wherein the second curved part is provided in plurality and a number of the second curved parts is two, and a width of the second curved parts is the same as a width of the first curved part and narrower than a width of the second attachment part.

3. The fan device mounting structure according to claim 2, wherein a threaded hole for threadably fastening the first attachment part to the fan device is formed in the first attachment part, a screw inserted into the threaded hole pierces through both faces of the first attachment part relative to an inserting direction of the screw, and an elastic member whose material is different from that of the flat spring is placed on both the faces of the first attachment part relative to the inserting direction.

4. The fan device mounting structure according to claim 2, wherein a threaded hole for threadably fastening the second attachment part to the chassis is formed in the second attachment part, a screw inserted into the threaded hole pierces through both faces of the second attachment part relative to an inserting direction of the screw, and an elastic member whose material is different from that of the flat spring is placed on both the faces of the second attachment part relative to the inserting direction.

5. The fan device mounting structure according to claim 2, wherein the second attachment part is attached to the chassis via an intermediate component.

6. A fan device mounting structure comprising:
   a fan device;
   a chassis in which the fan device is mounted; and
   a pair of flat springs, each flat spring having a first end attached to the fan device and bent to extend outwards from the fan device, and having a second end attached to outside an area in which the fan device is located,
   wherein opposing faces of the fan device facing each other are respectively supported by the flat springs so that the fan device is located separately from the chassis, and
   wherein each of the flat springs is bent in an S-shape as viewed from a front view of the fan device.

7. The fan device mounting structure according to claim 6, wherein each of the flat springs respectively includes:
   a first attachment part attached to the fan device,
   a second attachment part attached to the chassis, and
   a curved part extending from the first attachment part, lying between the first attachment part and the second attachment part, and having a plurality of inflection points,
   wherein the respective curved part includes:
   a first curved part extending from the first attachment part, and
   a second curved part lying between the first curved part and the second attachment part,
   wherein the first curved part is provided in plurality and a number of the first curved parts is two, and each of the first curved parts is composed of a strip-like curved part having a width narrower than a width of the first attachment part, and one first curved part extends from one width-direction end part of the first attachment part and another first curved part extends from another width-direction end part of the first attachment part, and
   wherein the second curved part is provided in plurality and a number of the second curved parts is two, and a width of the second curved parts is the same as a width of the first curved part and narrower than a width of the second attachment part.

8. The fan device mounting structure according to claim 7, wherein a threaded hole for threadably fastening the first attachment part to the chassis is formed in the first attachment part, a screw inserted into the threaded hole pierces through both faces of the first attachment part relative to an inserting direction of the screw, and an elastic member whose material is different from that of the flat spring is placed on both the faces of the first attachment part relative to the inserting direction.

9. The fan device mounting structure according to claim 7, wherein a threaded hole for threadably fastening the second attachment part to the chassis is formed in the second attachment part, a screw inserted into the threaded hole pierces through both faces of the second attachment part relative to an inserting direction of the screw, and an elastic member whose material is different from that of the flat spring is placed on both the faces of the second attachment part relative to the inserting direction.

10. The fan device mounting structure according to claim 7, wherein the second attachment part is attached to the chassis via an intermediate component.

11. A fan device mounting structure comprising:
  a fan device;
  a chassis in which the fan device is mounted; and
  a pair of flat springs, each flat spring having a first end attached to the fan device and bent to extend outwards from the fan device, and having a second end attached to outside an area in which the fan device is located,
  wherein opposing faces of the fan device facing each other are respectively supported by the flat springs so that the fan device is located separately from the chassis, and
  wherein each of the flat springs is bent in a bellows-shape as viewed from a front view of the fan device.

12. The fan device mounting structure according to claim 11,
  wherein each of the flat springs respectively includes:
    a first attachment part attached to the fan device,
    a second attachment part attached to the chassis, and
    a curved part extending from the first attachment part, lying between the first attachment part and the second attachment part, and having a plurality of inflection points,
  wherein the respective curved part includes:
    a first curved part extending from the first attachment part, and
    a second curved part lying between the first curved part and the second attachment part,
  wherein the first curved part is provided in plurality and a number of the first curved parts is two, and each of the first curved parts is composed of a strip-like curved part having a width narrower than a width of the first attachment part, and one first curved part extends from one width-direction end part of the first attachment part and another first curved part extends from another width-direction end part of the first attachment part, and
  wherein the second curved part is provided in plurality and a number of the second curved parts is two, and a width of the second curved parts is the same as a width of the first curved part and narrower than a width of the second attachment part.

13. The fan device mounting structure according to claim 12, wherein a threaded hole for threadably fastening the first attachment part to the fan device is formed in the first attachment part, a screw inserted into the threaded hole pierces through both faces of the first attachment part relative to an inserting direction of the screw, and an elastic member whose material is different from that of the flat spring is placed on both the faces of the first attachment part relative to the inserting direction.

14. The fan device mounting structure according to claim 12, wherein a threaded hole for threadably fastening the second attachment part to the chassis is formed in the second attachment part, a screw inserted into the threaded hole pierces through both faces of the second attachment part relative to an inserting direction of the screw, and an elastic member whose material is different from that of the flat spring is placed on both the faces of the second attachment part relative to the inserting direction.

15. The fan device mounting structure according to claim 12, wherein the second attachment part is attached to the chassis via an intermediate component.

* * * * *